(12) United States Patent
Rowden et al.

(10) Patent No.: US 10,347,608 B2
(45) Date of Patent: Jul. 9, 2019

(54) POWER MODULE

(71) Applicant: General Electric Company, Schenectady, NY (US)

(72) Inventors: Brian Lynn Rowden, Ballston Lake, NY (US); Ljubisa Dragoljub Stevanovic, Clifton Park, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 0 days.

(21) Appl. No.: 15/605,686

(22) Filed: May 25, 2017

(65) Prior Publication Data

US 2017/0345799 A1 Nov. 30, 2017

Related U.S. Application Data

(60) Provisional application No. 62/342,860, filed on May 27, 2016.

(51) Int. Cl.
*H01L 25/07* (2006.01)
*H01L 29/16* (2006.01)
(Continued)

(52) U.S. Cl.
CPC ........ *H01L 25/072* (2013.01); *H01L 29/1608* (2013.01); *H02M 7/003* (2013.01);
(Continued)

(58) Field of Classification Search
CPC ....... H05K 1/10231; H05K 1/141–144; H05K 7/026; B60K 16/0238; H01L 25/07; H01L 25/072; H01L 29/16; H01L 29/1608
(Continued)

(56) References Cited

U.S. PATENT DOCUMENTS 5,347,158 A * 9/1994 Matsuda ............... H01L 23/645
257/691
5,422,440 A 6/1995 Palma
(Continued)

FOREIGN PATENT DOCUMENTS

CN 105514072 A 4/2016
DE 102012201889 A1 10/2012
(Continued)

OTHER PUBLICATIONS

Xu, Y., et al, "Development of an ultra-high density Power Chip on Bus (PCoB) module," IEEE Energy Conversion Congress and Exposition (ECCE), pp. 7 (Sep. 18-22, 2016).
(Continued)

*Primary Examiner* — Tuan T Dinh
(74) *Attorney, Agent, or Firm* — Fletcher Yoder, P.C.

(57) ABSTRACT

A power module includes a first bus bar having a first plurality of tabs, wherein each of the first plurality of tabs is electrically coupled to a respective conductive trace of a plurality of conductive traces disposed on a first side; a second bus bar having a second plurality of tabs, wherein each of the second plurality of tabs is electrically coupled to a respective conductive trace of a plurality of conductive traces disposed on a second side; and a third bus bar having a third plurality of tabs, wherein at least one tab of the third plurality of tabs is electrically coupled to a respective conductive trace of the plurality of conductive traces disposed on the first side and at least one tab of the third plurality of tabs is electrically coupled to a respective conductive trace of the plurality of conductive traces disposed on the second side.

4 Claims, 34 Drawing Sheets

(51) Int. Cl.
*H02M 7/00* (2006.01)
*H01L 23/64* (2006.01)

(52) U.S. Cl.
CPC .... *H01L 23/645* (2013.01); *H01L 2224/0603* (2013.01); *H01L 2224/49111* (2013.01); *H01L 2224/49113* (2013.01)

(58) Field of Classification Search
USPC ....... 361/782–784, 803, 775, 814; 439/76.2; 257/177
See application file for complete search history.

(56) References Cited

U.S. PATENT DOCUMENTS

| | | | |
|---|---|---|---|
| 6,636,429 | B2 | 10/2003 | Maly et al. |
| 7,494,847 | B2 | 2/2009 | Karnezos et al. |
| 7,826,231 | B2 * | 11/2010 | Yamabuchi .......... H05K 7/1432 361/775 |
| 8,076,696 | B2 | 12/2011 | Beaupre et al. |
| 8,466,541 | B2 | 6/2013 | Jones et al. |
| 9,302,435 | B2 | 4/2016 | Hatori |
| 9,407,251 | B1 | 8/2016 | Passmore et al. |
| 9,589,868 | B2 | 3/2017 | McKnight-MacNeil et al. |
| 2002/0025709 | A1 * | 2/2002 | Murakami ............... H02B 1/20 439/251 |
| 2010/0148298 | A1 | 6/2010 | Takano et al. |
| 2014/0218871 | A1 | 8/2014 | Kim et al. |

FOREIGN PATENT DOCUMENTS

| | | |
|---|---|---|
| WO | 2014/208450 A1 | 12/2014 |
| WO | 2015/132847 A1 | 9/2015 |

OTHER PUBLICATIONS

International Search Report and Written Opinion issued in connection with corresponding PCT Application No. PCT/US17/034660 dated Aug. 25, 2017.

* cited by examiner

POWER MODULE

This application claims priority from and the benefit of U.S. Provisional Application Ser. No. 62/342,860, entitled "POWER MODULE" filed May 27, 2016, which is hereby incorporated by reference in its entirety for all purposes.

BACKGROUND

The field of the disclosure relates generally to power module assemblies and, more particularly, to an internal bus structure of a power module.

Conventional semiconductor power modules typically route signals via traces formed from a direct bond or active metal brazed copper or aluminum on a ceramic substrate. In such configurations, the traces are single layer and are required to be adjacent to one another on a planar surface (e.g., surface of the ceramic substrate). A plurality of semiconductor devices disposed across the module are wire bonded to the metal traces and to a bus bar to electrically couple the semiconductor devices to the module's main power terminals.

Such conventional power modules have attempted to reduce power loop commutation inductance via various configurations of internal layout routing on the substrate or within the side walls of the package. A typical approach is an optimization of a length and a width of the metal traces and an orientation of the semiconductor devices. In addition, bus bar structures having a plurality of planar (flat) bus bars disposed primarily in an orientation parallel to, and in close proximity to, the substrate have been utilized to provide a comparatively lower inductance. However, because of the close proximity of the bus bars to the substrate, the bus bars occupy a significant portion of the substrate area that could otherwise be allocated to additional semiconductor devices, thereby resulting in a lower current rating of the module. Therefore, such bus bar configurations make the modules inefficient and/or not suitable for, for example, higher power density and/or higher current applications. Moreover, the typical layout and assembly sequence of such bus bar configurations provide limited testing opportunities of individual components of the module (e.g., semiconductor devices, multiple devices assembled on substrates as sub-assemblies of the module, or the like).

Therefore, the inventors have developed an improved power module.

BRIEF DESCRIPTION

A power module has been provided herein. In some embodiments, a power module may include a plurality of conductive traces disposed on a first side of a surface and a second side of the surface, wherein the first side is opposite the second side; and a bus bar structure comprising: a first bus bar having a first plurality of tabs extending away from the first bus bar, wherein each tab of the first plurality of tabs is electrically coupled to a respective conductive trace of the plurality of conductive traces disposed on the first side of the surface; a second bus bar having a second plurality of tabs extending away from the second bus bar, wherein each tab of the second plurality of tabs is electrically coupled to a respective conductive trace of the plurality of conductive traces disposed on the second side of the surface; and a third bus bar having a third plurality of tabs extending away from the third bus bar, wherein at least one tab of the third plurality of tabs is electrically coupled to a respective conductive trace of the plurality of conductive traces disposed on the first side of the surface and at least one tab of the third plurality of tabs is electrically coupled to a respective conductive trace of the plurality of conductive traces disposed on the second side of the surface.

In some embodiments, a bus bar structure for a power module may include: a first bus bar having a first plurality of tabs extending away from the first bus bar; a second bus bar having a second plurality of tabs extending away from the second bus bar; and a third bus bar having a third plurality of tabs extending away from the third bus bar, wherein the first plurality of tabs, second plurality of tabs and third plurality of tabs are arranged such that tabs of the first plurality of tabs and tabs of the second plurality of tabs alternate along a first side of the bus bar structure and tabs of second plurality of tabs and tabs of the third plurality of tabs alternate along a second side of the bus bar structure.

In some embodiments, a bus bar structure for a power module may include: a first bus bar having a first plurality of tabs extending away from the first bus bar; a second bus bar having a second plurality of tabs extending away from the second bus bar; and a third bus bar having a third plurality of tabs extending away from the third bus bar, wherein the first plurality of tabs, second plurality of tabs and third plurality of tabs are arranged such that tabs of the first plurality of tabs and tabs of the second plurality of tabs alternate along a first side of the bus bar structure and tabs of second plurality of tabs and tabs of the third plurality of tabs alternate along a second side of the bus bar structure In some embodiments, a power module may include: a first plurality of semiconductor devices disposed in a first region of the power module; a second plurality of semiconductor devices disposed in a second region of the power module, wherein a non-conductive gap is disposed between the first region and second region; a bus bar structure comprising a first bus bar, a second bus bar and a third bus bar, wherein the third bus bar is configured to provide a conductive path across the non-conductive gap, and wherein the first plurality of semiconductor devices, second plurality of semiconductor devices, first bus bar, second bus bar and third bus bar are arranged such that a continuous electrical path is formed, the continuous electrical path comprising, an input of the power module, the first bus bar, an input of a semiconductor device of the first plurality of semiconductor devices, an output of the semiconductor device of the first plurality of semiconductor devices, the third bus bar, an input semiconductor device of the second plurality of semiconductor devices, an output of the semiconductor device of the second plurality of semiconductor devices, the second bus bar, an output of the power module.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

Figure 1:
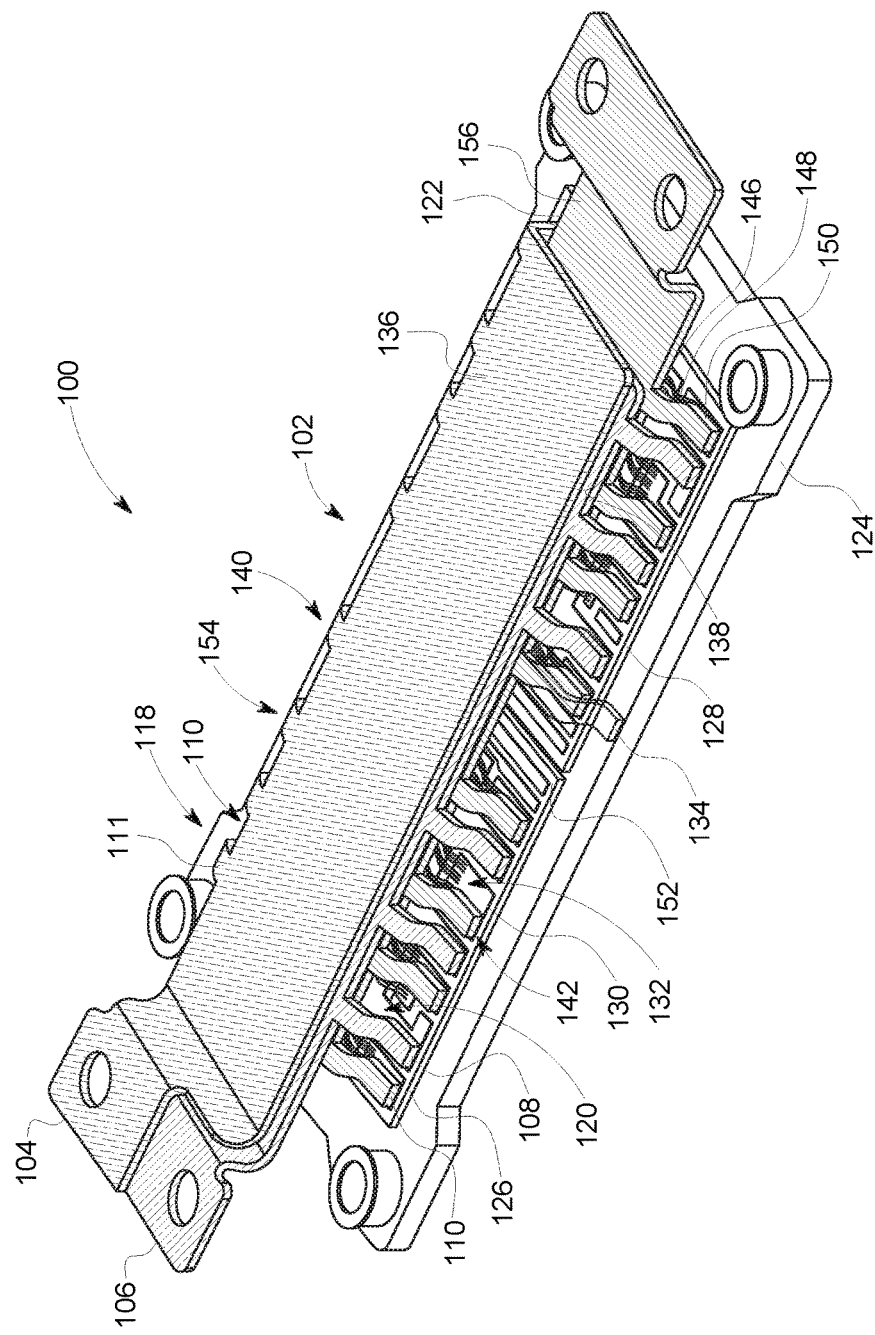
FIG. 1 depicts an inventive power module in accordance with some embodiments of the present invention.

Unless otherwise indicated, the drawings provided herein are meant to illustrate features of embodiments of this disclosure. These features are believed to be applicable in a wide variety of systems including one or more embodiments of this disclosure. As such, the drawings are not meant to include all conventional features known by those of ordinary skill in the art to be required for the practice of the embodiments disclosed herein. Moreover, features depicted or described with respect to particular embodiments or figures may be combined and/or interchanged with features depicted or described with respect to any other embodiments depicted or described herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Embodiments of a power module have been provided herein. The power module (dual power module) provided herein describes a low inductance packaging solution to enable fast switching and full utilization of wide band-gap semiconductor device technology. In at least some embodiments, the inventive power module may advantageously include a low inductance bus bar structure that provides a lower inductance as compared to conventional power modules. In addition, in at least some embodiments, the low inductance bus bar structure may allow for ease of manufacturability via flexible fabrication techniques and robust testing of portions of the power module, thereby allowing for selective sorting and/or removal of individual portions of the module, thus providing a high yielding manufacturing process. Moreover, in at least some embodiments, the low inductance bus bar structure may advantageously provide a reduced DC commutation loop and/or a DC commutation loop that is interleaved with an AC terminal to provide an electromagnetic interference (EMI)/electromagnetic compatibility (EMC) return path without impacting the power module configuration, thereby enabling higher switching speeds.

Referring to FIG. 1, in some embodiments, the dual power module (power module) 100 may generally comprise one or more substrates (two substrates 126, 128 shown) having conductive traces 130 formed thereon and a bus bar structure 102 electrically coupled to the conductive traces 130. The one or more substrates 126, 128 may be supported by a base 124.

The substrates 126, 128 may be any type of substrate suitable for use in a power module as describe herein. For example, in some embodiments, the substrates 126, 128 may include a ceramic body (e.g., alumina ($Al_2O_3$), aluminum nitride (AlN), silicon nitride ($Si_3N_4$), or the like) having at least one metallized surface. A plurality of conductive traces 130 may be formed atop the ceramic body, for example via direct bond or active metal brazed copper or aluminum on the ceramic body, wherein the conductive traces 130 are electrically isolated from one another via portions of the ceramic body disposed between the conductive traces 130. The conductive traces 130 may be disposed about the power module 100 in any manner suitable to provide electrical conductivity between the bus bars and semiconductor devices as described herein. For example, in some embodiments, a plurality of the conductive traces 130 may be disposed on a first side 142 of a surface 152 of the power module 100 (e.g., a surface of one or more of the substrates

126, 128) and a plurality of the conductive traces 130 may be disposed on a second side 140 of the surface 152, opposite the first side 142.

Although only two are shown in FIG. 1, any number of substrates 126, 128, for example, four or more, may be utilized. The inventors have observed utilizing multiple substrates 126, 128 may result in less mechanical failures of the substrates due to reduced mechanical stresses as compared to a single substrate that spans the entire power module 100. Moreover, in instances where a component of the power module 100 (e.g., semiconductor device, wire bonding, or the like) is found to be defective or faulty, one or more of the substrates 126, 128 may be selectively discarded and replaced, as opposed to replacement of a singular substrate containing all of the components, thereby providing a high yielding manufacturing process.

Figure 2:
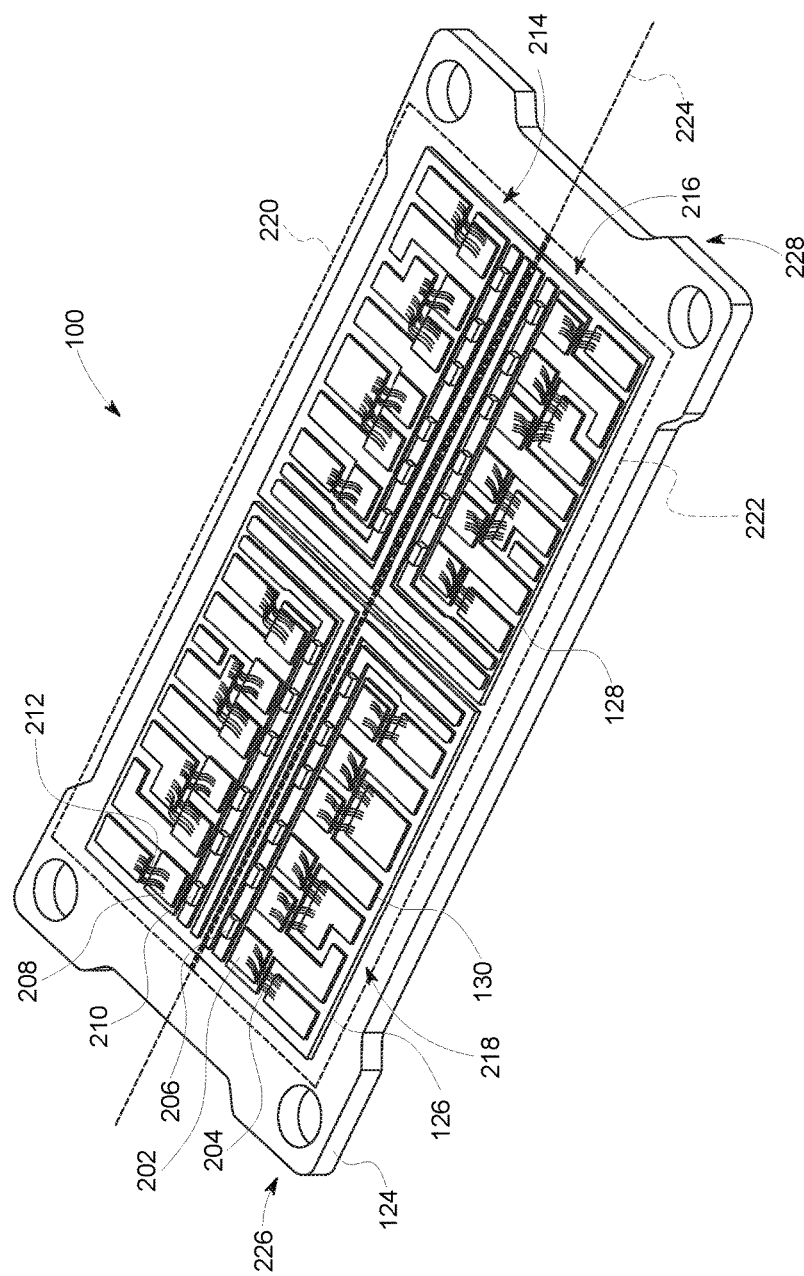
FIG. 2 depicts a portion of the power module shown in FIG. 1.

The substrates 126, 128 may further include a plurality of semiconductor devices coupled to the one or more conductive traces 130 either directly or via wire bonds, and a plurality of respective gate connections for the plurality of semiconductor devices (obscured from view in FIG. 1, semiconductor devices 202, 208, gate connections 206, 210 and wire bonds 204, 212 shown in FIG. 2). Any number of semiconductor devices 202, 208 suitable for a desired application may be present in the module 100. For example, in some embodiments, the module 100 may comprise about 24 semiconductor devices. Other embodiments may include more (e.g., 48 semiconductor devices such as shown in FIGS. 14-23) or less (e.g., 16 semiconductor devices such as shown in FIGS. 8-13). The semiconductor devices 202, 208 may be disposed about the substrates 126, 128 in any manner suitable for a desired application and such disposition may be dependent on desired power module operating parameters, spatial constraints, bus bar placement, or the like. For example, in some embodiments, the semiconductor devices 202, 208 may be distributed symmetrically about each of the substrates 126, 128 in one or more groups (e.g., a first group 214 or, collectively, upper switch 220, and a second group 216 or, collectively, lower switch 222 shown). In some embodiments, the first group 214 (upper switch 220) and second group 216 (lower switch 222) may disposed on opposing sides of an axis, for example such as an axis 224 (e.g., a "longitudinal axis") extending from a first end 226 to a second end 228 of the module 100 such as shown in FIG. 2.

Although not shown, additional components known in the art that are suitable for operation of the gate connections or other electronic components with respect to the semiconductor devices 202, 208, for example, electrical couplings or connectors, gate resistors, or the like, may also be present.

The semiconductor devices may be any type of semiconductor device suitable for a desired application, for example metal oxide semiconductor field effect transistors (MOSFET), insulated-gate bipolar transistors (IGBT), junction gate field-effect transistors (JFET), or bipolar junction transistors (BJT), or the like. The module may also include PiN diodes, Schottky barrier diodes, merged PiN-Schottky (MPS) diodes, junction barrier Schottky (JBS) diodes, or the like. In addition, the semiconductor devices may be wide band-gap semiconductor devices such as those at least partially fabricated from silicon carbide (SiC), aluminum nitride (AlN), gallium nitride (GaN), or the like. Although shown FIG. 2 as disposed inward of the semiconductor devices 202, 208, the gate connections 206, 210 may be disposed about the substrate 126, 128 in any location about the substrate 126, 128, for example, such as proximate an outer periphery 218 of the substrates 126, 128. One such example of an alternate placement of the gate connectors is described below with respect to FIGS. 17-18.

Referring back to the power module 100 shown in FIG. 1, in some embodiments, the bus bar structure 102 is a laminated bus bar structure. In such embodiments, the bus bar structure 102 may have a plurality of bus bars (e.g., a first bus bar 104, second bus bar 106 and third bus bar 122 shown in FIG. 1). When present, each of the plurality of bus bars of the bus bar structure 102 may be configured such that the respective bus bar provides a desired electrical functionality. For example, in a dual power module (e.g., power module 100) the first bus bar 104 may be configured to receive a current of a first polarity (e.g., a negative or DC− current), the second bus bar 106 may be configured to receive a current of a second polarity (e.g., a positive or DC+ current), and the third bus bar 122 configured to output a power (e.g., an AC output).

Each of the plurality of bus bars may be shaped and sized in any manner suitable to facilitate the desired electrical couplings described herein while providing a reduced inductance, and such configurations may be dependent on dimensions of the module, intended application of the module, or the like. For example, in some embodiments, each of the plurality of bus bars may comprise a planar or flat component (planar component) 136, 138, 156 of bus bars 104, 106, 122, respectively. When present the planar component may be dimensioned such that a width of the planar or flat component is greater, or in some embodiments substantially greater, than a thickness of the planar component, for example, such as shown in FIG. 1. The inventors have observed that dimensioning the planar component in such a manner maximizes the overall surface area of the bus bar, which facilitates a reduction in inductance, while allowing for a suitable adhesion between the bus bars necessary to form a laminated bus bar structure.

The bus bars 104, 106, 122 may be arranged in any manner suitable to provide the functionality of the module 100 as described herein. For example, in some embodiments, a planar component 136, 138, 156 of each of the bus bars 104, 106, 122 may at least partially overlap with a planar component 136, 138, 156 of the other bus bars 104, 106, 122. Moreover, in some embodiments, the planar component 136, 138, 156 of each of the bus bars 104, 106, 122 may be disposed either above or below a planar component 136, 138, 156 of the other bus bars 104, 106, 122. In such embodiments, each of the planar components 136, 138, 156 may be disposed parallel to at least one of another of the planar components 136, 138, 156 and/or parallel to the base 124.

An exemplary configuration of the above described bus bar 104, 106, 122 arrangement is shown in FIG. 1. In the embodiment shown, each of the planar component 136 of the first bus bar 104, planar component 138 of the second bus bar 106 and planar component 156 of the third bus bar 122 overlap with one another. Moreover, as shown, each of the planar components 136, 138, 156 are substantially parallel or parallel to one another and/or substantially parallel or parallel to the base 124.

Although shown in a particular order in FIG. 1, the first bus bar 104, second bus bar 106 and third bus bar 122 may be arranged in any manner suitable and such arrangement may be dependent on dimensions of the module, intended application of the module, or the like. For example, in some embodiments, the third bus bar 122 (e.g., AC bus bar) may be disposed above or below the first bus bar 104 (e.g., DC− bus bar) and second bus bar 106 (e.g., DC+ bus bar), or disposed between the first bus bar 104 and second bus bar 106.

In some embodiments, insulation layers (not shown) may be positioned on one or more surfaces (e.g., atop one or more surfaces, about or on the edges, sealing the edges, between the bus bars 104, 106, 122, or the like). Moreover, in some embodiments, the bus bar structure 102 may be a standard copper configuration designed to be insulated by multiple techniques including fully laminated bus structure, fully molded as typically done for dual inline pin package (DIP) or the like style design, non-insulated submerged in dielectric, individual stripline configurations, or the like. When present, the insulating layers function to reduce a distance between the bus bars 104, 106, 122, thereby reducing inductance. The insulation layers may be any type of suitable insulation layers, for example, polymer based insulation layers, and may be embodied in a polyimide film, flexible ceramics, hybrid polymer ceramic, and an adhesive, such as, but not limited to, a fluoropolymer adhesive and a silicone compatible adhesive, such as, but not limited to Kapton®.

Each of the bus bars 104, 106, 122 may include a plurality of tabs (feet) (e.g., tabs 111, 108, 110 shown for bus bars 104, 106, 122 respectively) configured to electrically couple the bus bars 104, 106, 122 to the conductive traces 130. When coupled to the conductive traces 130, the tabs 111, 108, 110 may be coupled via any suitable mechanism, for example such as soldering, ultrasound welding, brazing, or the like.

The tabs 111, 108, 110 may be configured in any manner suitable to provide the electrical couplings described herein, and such configurations may be dependent on dimensions of the module, intended application of the module, or the like. For example, in some embodiments, the tabs 111, 108, 110 may be protrusions or extensions extending away from the planar component of the respective bus bar having a length sufficient to couple the bus bars 104, 106, 122 to the desired conductive traces 130. Alternatively, in some embodiments, each of the tabs 111, 108, 110 may comprise two or more portions configured to allow for the bus bars 104, 106, 122 to be positioned above the substrates 126, 128 at a desired distance from the substrates 126, 128 while facilitating coupling of the bus bars 104, 106, 122 to the desired conductive traces 130. For example, each tab 111, 108, 110 may comprise a first portion 146, second portion 148 and third portion 150, such as shown in FIG. 1. In such embodiments, the first portion 146 may extend away from a side of the respective bus bar 104, 106, 122 in a first direction, the second portion 148 may be coupled to the first portion 146 and extend away from the first portion 146 in a second direction different from the first direction, and the third portion 150 may be coupled to the second portion and extend away from the first portion 146 in a third direction different from the second. In some embodiments, the third portion 150 may be oriented such that the third portion 150 is substantially parallel with the planar component of the respective bus bar or substrates 126, 128 when the bus bars 104, 106, 122 are coupled to the substrates 126, 128.

The tabs 111, 108, 110 may be arranged in any configuration suitable to achieve desired performance of the power module and such arrangements may be dictated by size constraints, number of semiconductor devices present, or the like. For example, in some embodiments, each of the first bus bar 104 and second bus bar 106 may include tabs along a single side of the respective bus bar, wherein the tabs of the first bus bar 104 protrude from the bus bar structure 102 in an opposing direction as the tabs of the second bus bar 106 (e.g., tabs 111 shown disposed on a side 118 of the first bus bar 104 and tabs 108 shown disposed on a side 132 of the second bus bar 106). In such embodiments, the third bus bar 122 may include tabs 110 disposed on both a first side 120 of the third bus bar 122 and second side 154 of the third bus bar 122, the second side 154 opposing the first side 120. Configuring the tabs 111, 108, 110 and bus bars 104, 106, 122 allows for each of the bus bars to be selectively coupled to desired conductive traces 130 throughout the power module 100. For example, in the configuration described above, the first bus bar 104 may be coupled to conductive traces disposed on the second side 140 of the power module 100 via the tabs 111 of the first bus bar 104, the second bus bar 106 coupled to conductive traces disposed on the first side 142 of the power module 100 via the tabs 108 of the second bus bar 106 and the third bus bar 122 coupled to conductive traces disposed on the first side 142 and second side 140 of the power module 100 via the tabs 110 of the third bus bar 122.

In addition, in some embodiments, the tabs 111, 108, 110 may be arranged such that tabs from each of the first bus bar 104, second bus bar 106 and third bus bar 122 alternate along the power module 100. For example, as shown in FIG. 1, tabs 111 from the first bus bar 104 and tabs 110 from the third bus bar 122 alternate along the second side 140 of the power module 100 and tabs 110 from the third bus bar 122 and tabs 108 from the second bus bar 106 alternate along the first side 142 of the power module 100. The inventors have observed that arranging the tabs in such an alternating fashion results in cancellation of a majority of magnetic field and reduces the energy stored in the magnetic field. This results in lower f1 inductance of the current flow path (commutation loop), for example, such as described below. Although shown as being arranged as along a uniform plane in FIG. 1, the tabs 111, 108, 110 may protrude at varying distances from the bus bar structure 102. Moreover, in some embodiments, one or more of the tabs 111, 108, 110 may at least partially overlap another of the tabs 111, 108, 110, for example, such as shown in phantom at 134. In such embodiments, layers of insulation (e.g., such as the insulating layers described above, may be disposed between the tabs 111, 108, 110). The inventors have observed that reducing the spacing between each of the tabs 111, 108, 110 will result in better cancellation of the magnetic field and a reduction in inductance.

The inventors have observed that utilizing the tabs 111, 108, 110 to couple the bus bars 104, 106, 122 to the conductive traces 130 allows for a robust coupling of the components while avoiding process difficulties typically found in the conventionally utilized wire bonding coupling mechanisms, for example, such as poor wirebond adhesion, damage to underlying components caused by the amount of energy required to facilitate the bonding or repeated attempts upon instance of bonding failure, etc. Moreover, the tabs 111, 108, 110 allow the bus bars 104, 106, 122 to be positioned substantially or directly atop one another while minimizing staircasing to leave exposed area that would otherwise be required to facilitate wire bonding directly to bus bars, thereby maximizing width of each of the bus bars 104, 106, 122. Such maximization of bus bar width facilitates a reduction of inductance, increases manufacturing capability, and reduces the overall resistance of the bus structure, thus either increasing the current handling capability or lowering the overall temperature rise in the bus bar. Moreover, the inventors have further observed that the tabs 111, 108, 110 allow for the bus bar structure 102 to form at least a partial enclosure about components of the module (e.g., the semiconductor devices or the like) such that the bus bar structure 102 may function as a Faraday shield, thereby mitigating potential EMI/EMC problems. In addition, the inventors have observed that utilizing the tabs 111, 108, 110 as described above may allow the bus bar structure 102 to be coupled to the power module 100 after fabrication of a substantial portion of the module (e.g., as opposed to a wire bonded bus bar structure that requires coupling of the bus bar as an intermediate step in the fabrication process). Such fabrication process flexibility allows for components of the module to be fully tested independently and prior to coupling the bus bar structure 102 to the power module 100. For example, prior to coupling the bus bar structure 102 to the traces 130, the substrates 126, 128 (including the semiconductor devices 202, 208) may be fully tested at a higher power (e.g., static and/or dynamic testing, switching test, or the like). Such testing may advantageously allow for the identification and selective removal of defective or sub-par semiconductor devices and/or substrates (e.g., in instances where the module comprises multiple substrates such as described above), thus allowing for replacement of such defective or subpar substrates without the need to discard the remaining good substrates in the power module 100. In the case of a conventional wire bonded bus bar assembly the above described testing would not be achievable prior to completion of the module assembly, making it impossible to fully test and selectively remove defective or sub-par substrates. As a consequence, a single defective component (e.g., chip) would render the entire module faulty.

As discussed above, the inventors have observed that the presence and arrangement of the tabs 111, 108, 110 of the bus bars 104, 106, 122 may result in better magnetic field cancellation and lower commutation loop inductance as compared to conventional module configurations which typically require a current flow between semiconductor devices to traverse the module via multiple traces and wire bonds.

Figure 3:
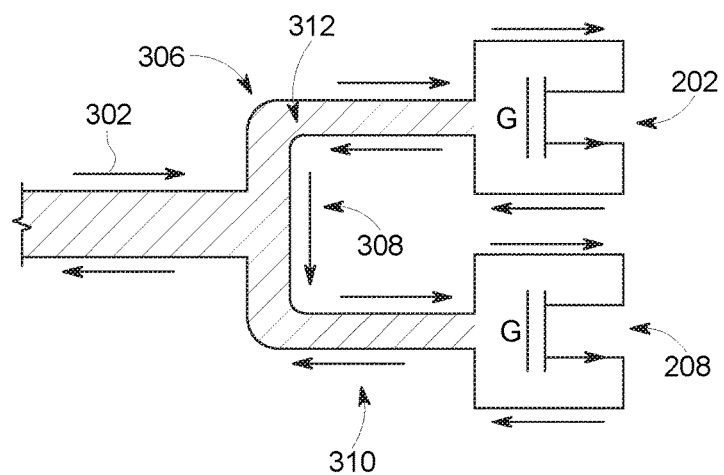
FIG. 3 depicts a current flow path during commutation switching of the inventive power module as described herein.

For example, FIG. 3 depicts a simplified partial electrical schematic of an exemplary current flow path 302 during commutation switching of the embodiments of the inventive power module as described herein. The figure illustrates an approach for reducing module inductance by minimizing a physical spacing between conducting paths. As shown, the current flow path 302 approaches a first semiconductor device (semiconductor device 202) via a path 306 (e.g., such as via the second bus bar 106 as described above). The flow path exits the first semiconductor device 202 and is directed towards the second semiconductor device 208 via path 308 (e.g., such as across the power module 100 via the third bus bar 122 described above). The flow path exits the second semiconductor device 208 and is directed away from the second semiconductor device 208 and towards, for example, an output via path 310 (e.g., such as via the first bus bar 104 described above). As shown in the figure, the shaded regions indicated at 312 represent a stored magnetic energy. The inventors have observed that such stored magnetic energy may be minimized by minimizing a physical spacing between conduction paths (e.g., such as described herein), thereby reducing the inductance of the power module 100.

Figure 4:
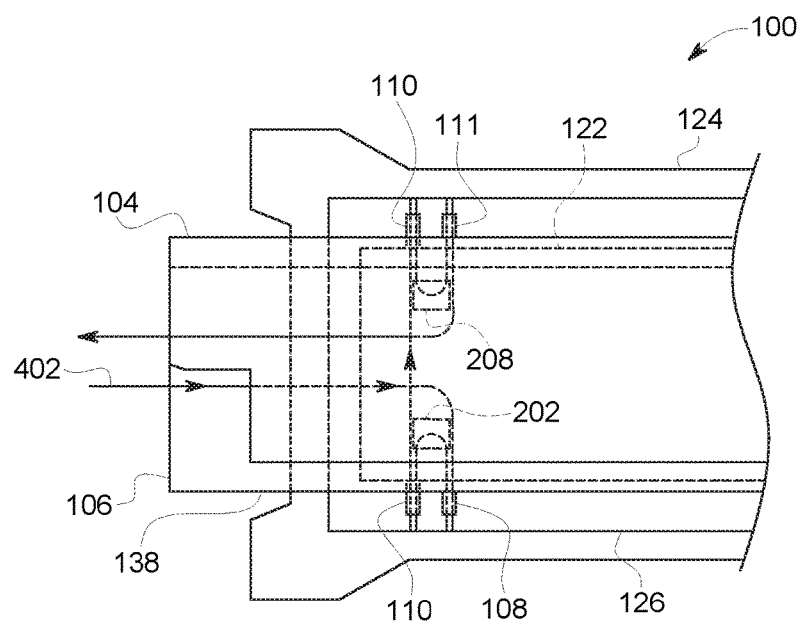
FIG. 4 depicts a partial electrical schematic of the current flow path that corresponds to the physical structure of the embodiment of the power module shown in FIG. 1.

FIG. 4 depicts an exemplary current flow path (conduction path) of the embodiments of the inventive power module described herein (e.g., power module 100). FIG. 4 provides an ex exemplary mechanism by which the inventive power module 100 may achieve a low commutation loop inductance and, as such, a reduction of module inductance via the approach described above in FIG. 3.

As shown, the current flows (current flow path indicated at 402) from an input to a tab 108 of the second bus bar 106 (e.g., DC+ bus bar) via a portion of the planar component 138 of the second bus bar 106. The current then flows from the tab 108 and along one or more traces (e.g., traces 130 shown in FIG. 1) of the substrate (e.g., substrate 126) through one or more semiconductor devices (e.g., semiconductor device 202). From the one or more semiconductor devices the current flows towards a tab 110 of the third bus bar 122 (e.g., AC bus bar) and turns, traveling up the tab 110 and across a portion of the third bus bar 122 to an opposing tab 110 of the third bus bar 122. The current then flows down the opposing tab 110 and along one or more traces of the substrate to turn first inward and then to a second one or more semiconductor devices (e.g., semiconductor device 208). From the second semiconductor device the current flows towards a tab 111 of the first bus bar 104 (e.g., DC− bus bar) and turns up the tab 111 and to an output via a portion of the first bus bar 104. Although shown as traveling in a particular direction, it is to be understood that the current flow 402 may be arranged in a similar but opposite direction from that shown in the figure, and such direction may be dependent on the configuration or application of the power module 100.

The inventors have observed that by routing the electrical flow as described above, and as facilitated by the bus bar structure as described herein, relatively tight loops encompassed by both longitudinal and transversal may be achieved. Without intending to be bound by theory, the inventors believe that the presence and configuration of the third bus bar (e.g., the AC bus bar) with respect to the other bus bars within the power module plays an important role in achieving the comparatively very low commutation loop inductance described herein. To this end, the configuration of the third bus bar facilitates the commutation current flow along the third bus bar from one side of the module to the other and the loop inductance is minimized due to the close proximity of the bus bars (e.g., the above described first 104, second 106 and third 122 bus bars or DC+, DC− and AC bus bars).

Figure 5:
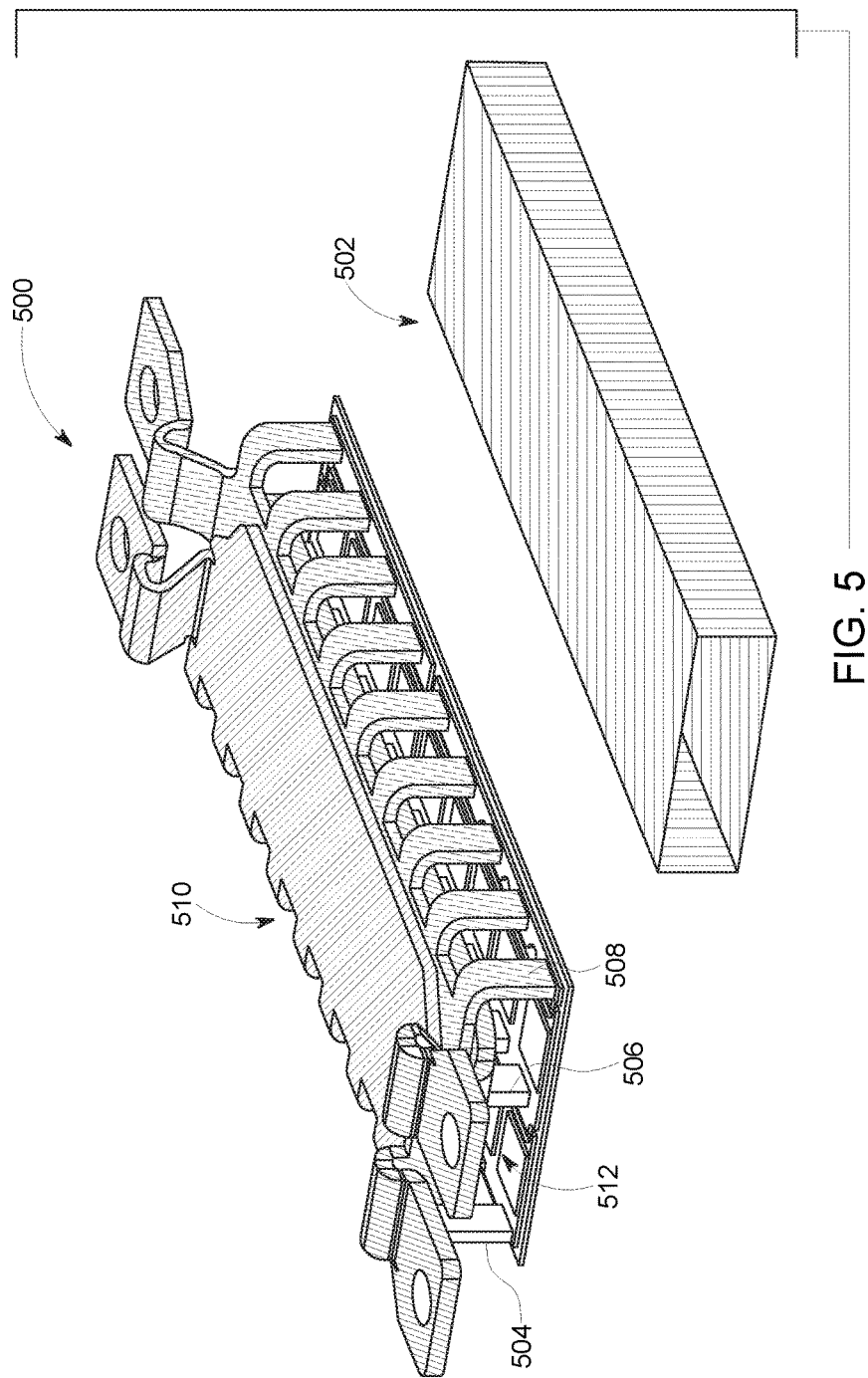
FIG. 5 depicts a prior art power module.

FIG. 5 depicts a prior art module 500 having a bus bar structure 510 that is comparatively different from the bus bar structure of the inventive module described herein. Notably, at least one significant difference between the prior art module 500 and the inventive module described herein is that the bus bars in FIG. 5 encompass a comparatively larger volume 502 in which electromagnetic energy is stored, resulting in comparatively higher module inductance, as compared to the smaller electromagnetic energy storage area and lower module inductance provided by the inventive power module described herein.

As shown in FIG. 5, the prior art bus bar structure 510 includes multiple DC bus bars 504, 508 coupled to a substrate along opposing sides of the substrate and an AC bus bar 506 coupled to the substrate along a proximate middle of the substrate (e.g., between an upper and lower switch or between an upper group and lower group of devices). The inventors have observed that in such prior art modules, a volume 502 where the electromagnetic energy is stored corresponds to a volume 512 of a space beneath the bus bar structure 510. The high volume where the electromagnetic energy is stored causes an increase in the module inductance, thereby increasing the overall commutation loop inductance. As such, due to the higher volume of electromagnetic energy storage of the prior art module 500, the prior art module 500 could not achieve the low commutation loop inductance achieved by the inventive power module described herein.

Figure 6:
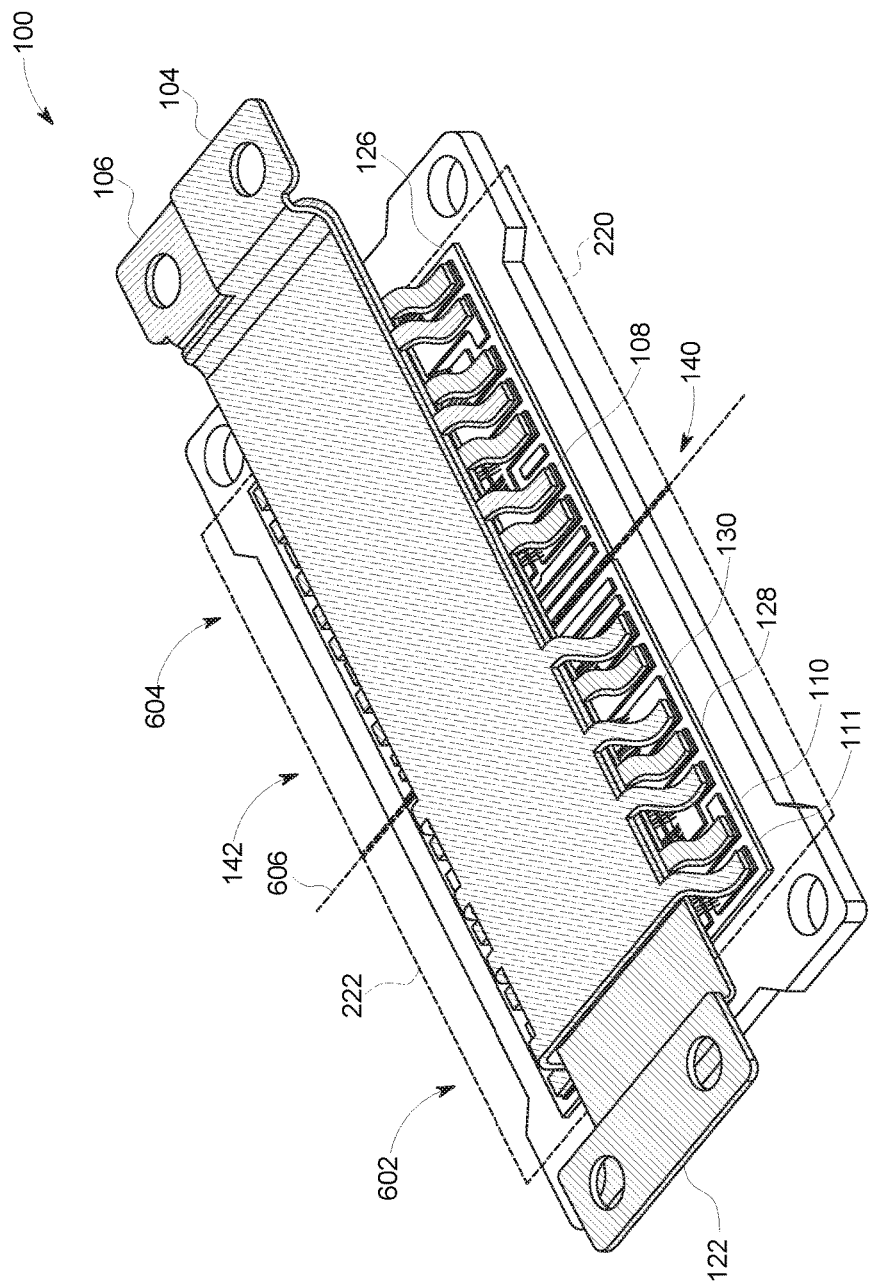
FIG. 6 depicts an embodiment of the inventive power module in accordance with some embodiments of the present invention.

Although shown in a particular configuration in the above figures, the upper switch 220 (e.g., the first group 214 of semiconductor devices) and the lower switch 222 (e.g., the second group 216 of semiconductor devices) 202, 208 may be disposed about the substrates 126, 128 in any manner suitable for a desired application and such disposition may be dependent on desired power module operating parameters, spatial constraints, bus bar placement, or the like. For example, as discussed above, FIGS. 1-2 depict the upper switch 220 and lower switch 222 disposed on opposing sides of the longitudinal axis 224. Alternatively, in some embodiments, the upper switch 220 and lower switch 222 may be disposed on opposing sides of an axis 606 (e.g., a "transversal axis") that extends from the first side 142 to the second side 140 of the power module 100, such as shown in FIG. 6. In such embodiments, the bus bars 104, 106, 122 of the bus bar structure 102 are coupled to the respective groups of semiconductor devices such as described above. For example, tabs 111 of the first bus bar 104 are electrically coupled to semiconductor devices of the lower switch 222 via the traces 130, tabs 108 of the second bus bar 106 are coupled to semiconductor devices of the upper switch 220 via the traces 130 and tabs 110 of the third bus bar 122 are electrically coupled to semiconductor devices of both the upper switch 220 and the lower switch 222 via the traces 130, such as shown in FIG. 6. As shown in the figure, when the upper switch 220 and lower switch 222 may be disposed on opposing sides of an axis 606 each of the bus bars 104, 106, 122 may include tabs on both the first side 142 and second side 140 of the power module 100. Moreover, in such a configuration one or more of the bus bars 104, 106, 122 may include respective tabs across a portion of the power module 100. For example, in some embodiments, the first bus bar 104 may include tabs 111 on a first side 602 of the axis 606, the second bus bar 106 may include tabs 108 on a second side 604 of the axis 606 and the third bus bar 122 may include tabs 110 on both the first side 602 and second side 604 of the axis 606, such as shown in FIG. 6.

Figure 7A:
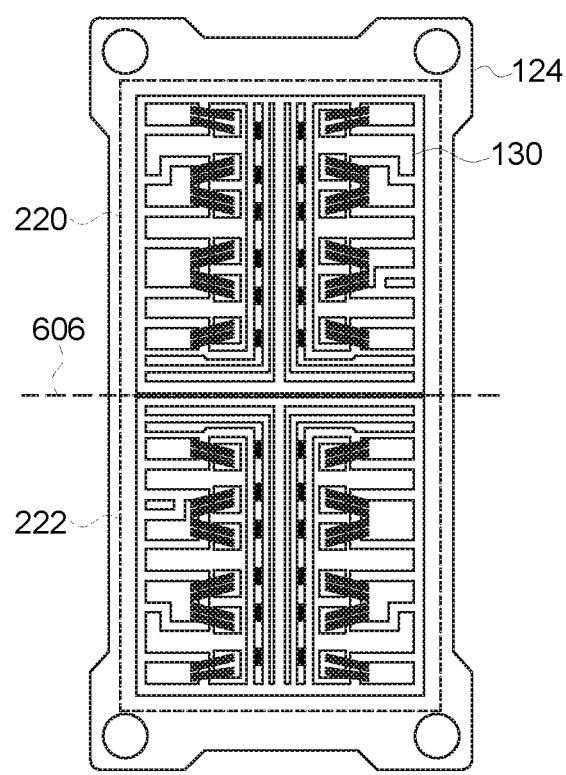
FIGS. 7A-D depict the power module shown in FIG. 6 in progressive stages of assembly.
Figure 7B:
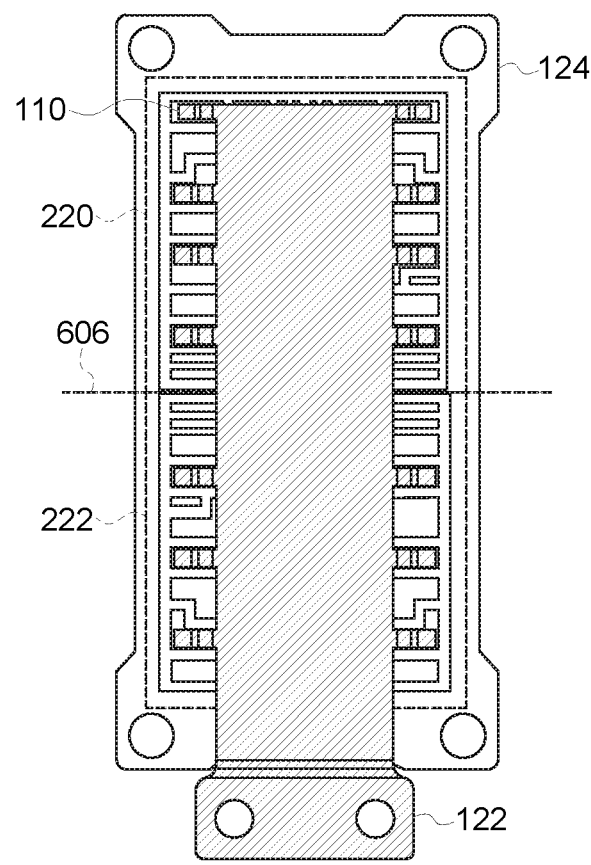
Figure 7C:
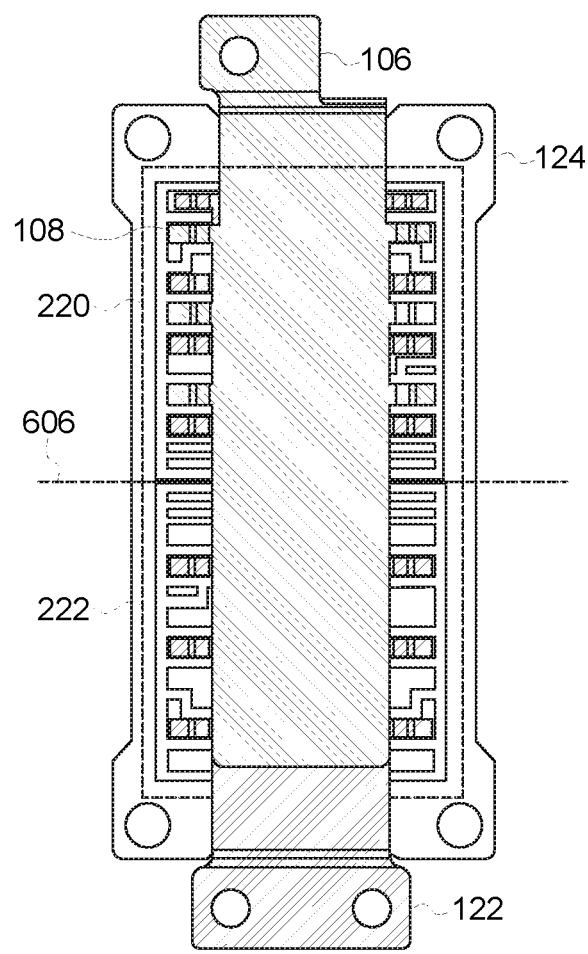
Figure 7D:
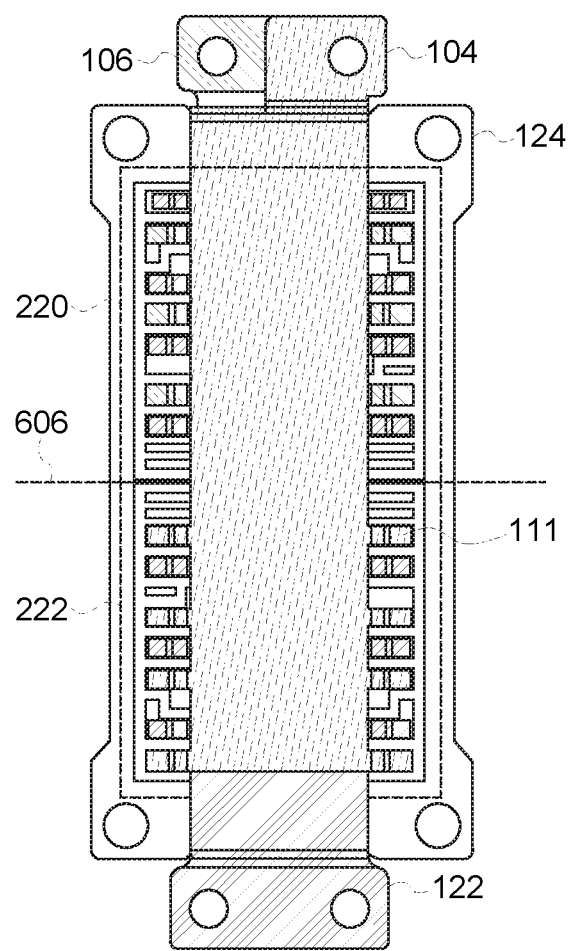

FIGS. 7A-D depict the power module shown in FIG. 6 in progressive fabrication stages and are provided to illustrate the relative placement of each of the base 124, upper switch 220, lower switch 222, first bus bar 104, second bus bar 106 and third bus bar 122 with respect to one another. Moreover, FIGS. 7A-D depict an embodiment of a sequence for at least partially assembling the module 100/bus bar structure 102. For example, as shown in FIGS. 7A-D, the third bus bar 122 may be first positioned atop the base 124 (FIG. 7B), the second bus bar 106 may then be positioned above the third bus bar 122 (FIG. 7C) and the first bus bar 104 may then be positioned above the second bus bar 106 (FIG. 7D). The tabs of each of the respective bus bars 104, 106, 122 may be coupled to the traces at any time during the assembly of the module 100 (e.g., each bus bar may be coupled to the respective traces after placement of the bus bar or coupled to the traces after two or more of the bus bars are positioned). The tabs of each of the respective bus bars 104, 106, 122 may be coupled to the traces via any suitable process, for example, such as soldering, welding, brazing or the like.

Figure 8:
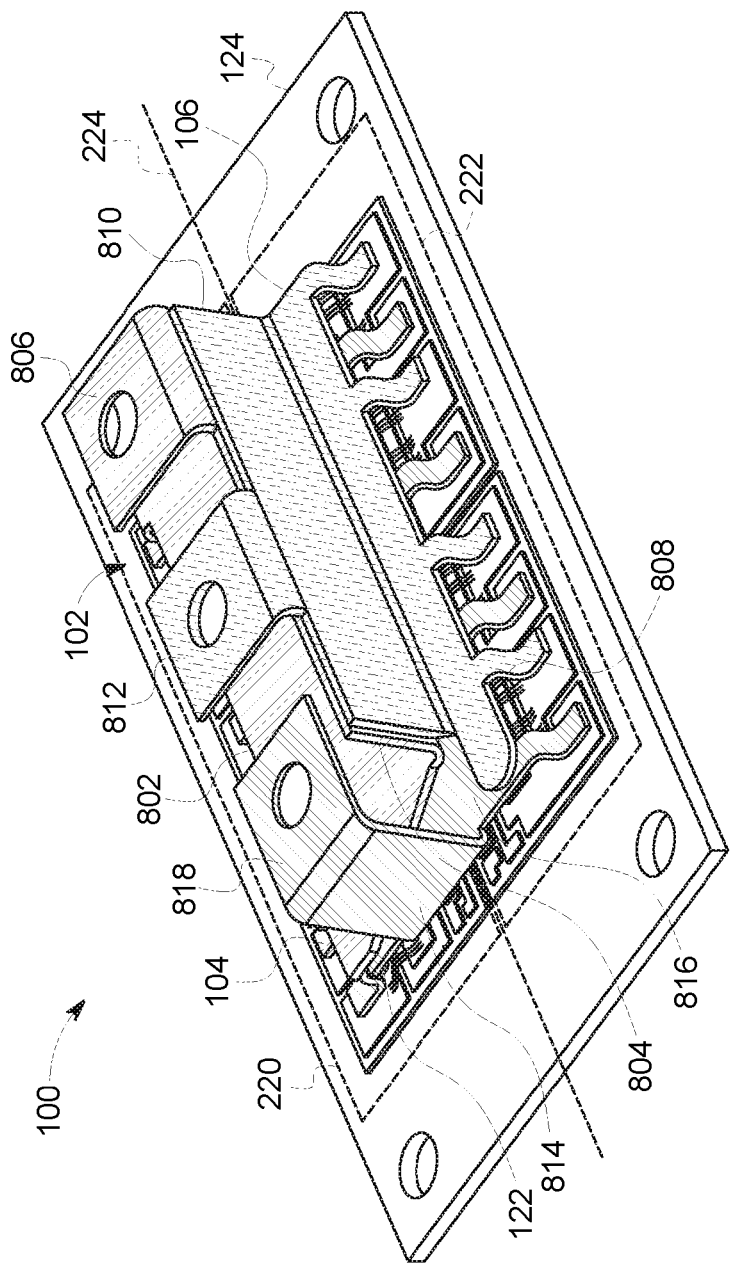
FIG. 8 depicts an embodiment of the inventive power module in accordance with some embodiments of the present invention.
Figure 9:
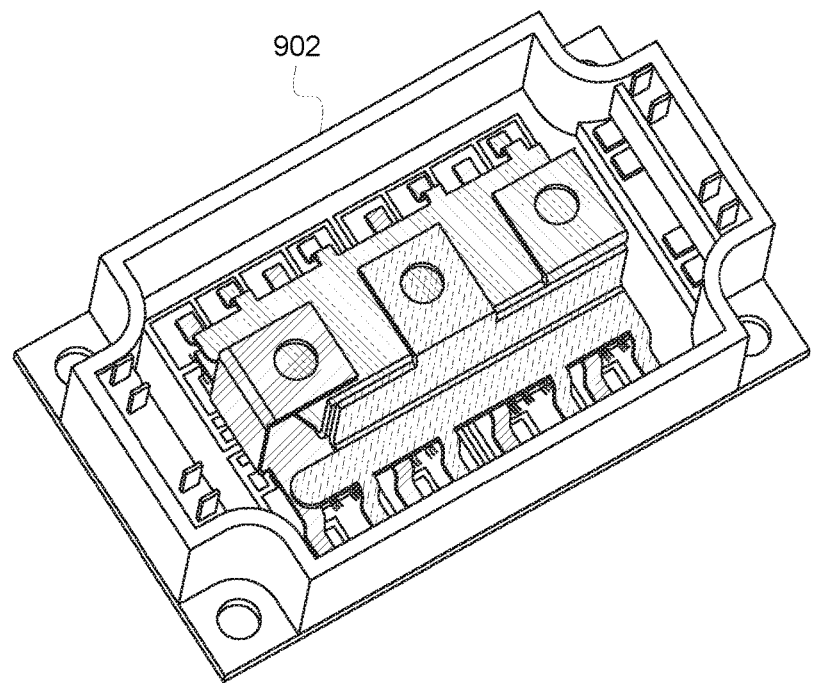
FIG. 9 depicts the power module shown in FIG. 8 with at least a portion of a housing suitable for use with the module.
Figure 10:
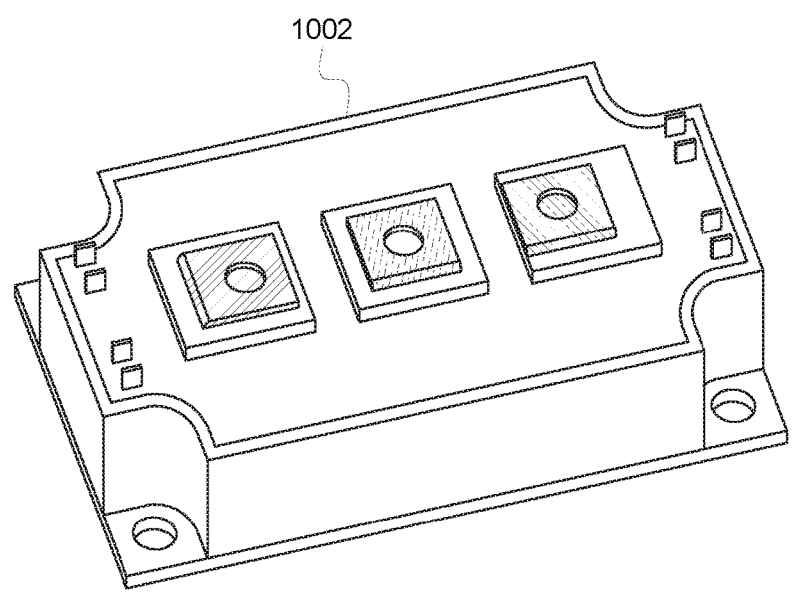
FIG. 10 depicts the power module shown in FIG. 8 with at least a portion of a housing suitable for use with the module.

FIG. 8 depicts an alternate embodiment of the power module in accordance with some embodiments of the present invention. In the embodiment depicted in FIG. 8, the positioning of the upper switch 220 and lower switch 222 and respective bus bar tab configuration is similar to that of FIGS. 1-2 (e.g., on opposing sides of the longitudinal axis 224).

Although shown above as having a particular configuration in the above embodiments, the bus bar structure 102 may be configured in any manner suitable for a desired application. For example, in some embodiments each of the bus bars 104, 106, 122 may have a plurality of portions coupled to one another and configured to accommodate for a desired design requirement, such as shown in FIG. 8.

For example, in some embodiments, the first bus bar 104 may comprise a first portion 802 that is disposed in an orientation or direction similar to that of, or in some embodiments, substantially parallel or parallel to, the base 124 and a second portion 804 coupled to the first portion 802, wherein the second portion 804 is disposed in an orientation or direction away, or in some embodiments, substantially perpendicular or perpendicular, to the first portion 802. The first bus bar 104 may further include a tab 806 configured to be coupled to, for example, an input or output, that is disposed in an orientation similar to that of the first portion 802. In some embodiments, the second bus bar 106 may comprise a first portion 808 that is disposed in an orientation or direction similar to that of, or in some embodiments, substantially parallel or parallel to, the base 124 and a second portion 810 coupled to the first portion 808, wherein the second portion 810 is disposed in an orientation or direction away, or in some embodiments, substantially perpendicular or perpendicular, to the first portion 808. The second bus bar 106 may further include a tab 812 configured to be coupled to, for example, an input or output, that is disposed in an orientation similar to that of the first portion 808. In some embodiments, the third bus bar 122 may comprise a first portion 816 that is disposed in an orientation or direction similar to that of, or in some embodiments, substantially parallel or parallel to, the base 124 and a second portion 814 coupled to the first portion 816, wherein the second portion 814 is disposed in an orientation or direction away, or in some embodiments, substantially perpendicular or perpendicular, to the first portion 816. The third bus bar 122 may further include a tab 818 configured to be coupled to, for example, an input or output, that is disposed in an orientation similar to that of the first portion 816. Any of the above described portions (e.g., portions 802-818) may be shaped in any manner suitable for a particular application. For example, in some embodiments, at least some of the portions are substantially flat or planar.

In any of the above embodiments, at least one portion of each bus bar may overlap at least one portion of another bus bar. For example, in the embodiment shown, both the first portion 802 of the first bus bar 104 and the first portion 808 of the second bus bar at least partially overlap the first portion 816 of the third bus bar 122, and the second portion 804 of the first bus bar 104 at least partially overlaps with the second portion 810 of the second bus bar 106.

The various configurations described above may allow the power module 100 to be utilized within various housings, enclosure, packages or forms, or the like (e.g., such as the enclosures 902, 1002, shown in FIGS. 9 and 10, respectively) while maintaining the advantages of the inventive power module 100 as described herein.

Figure 11:
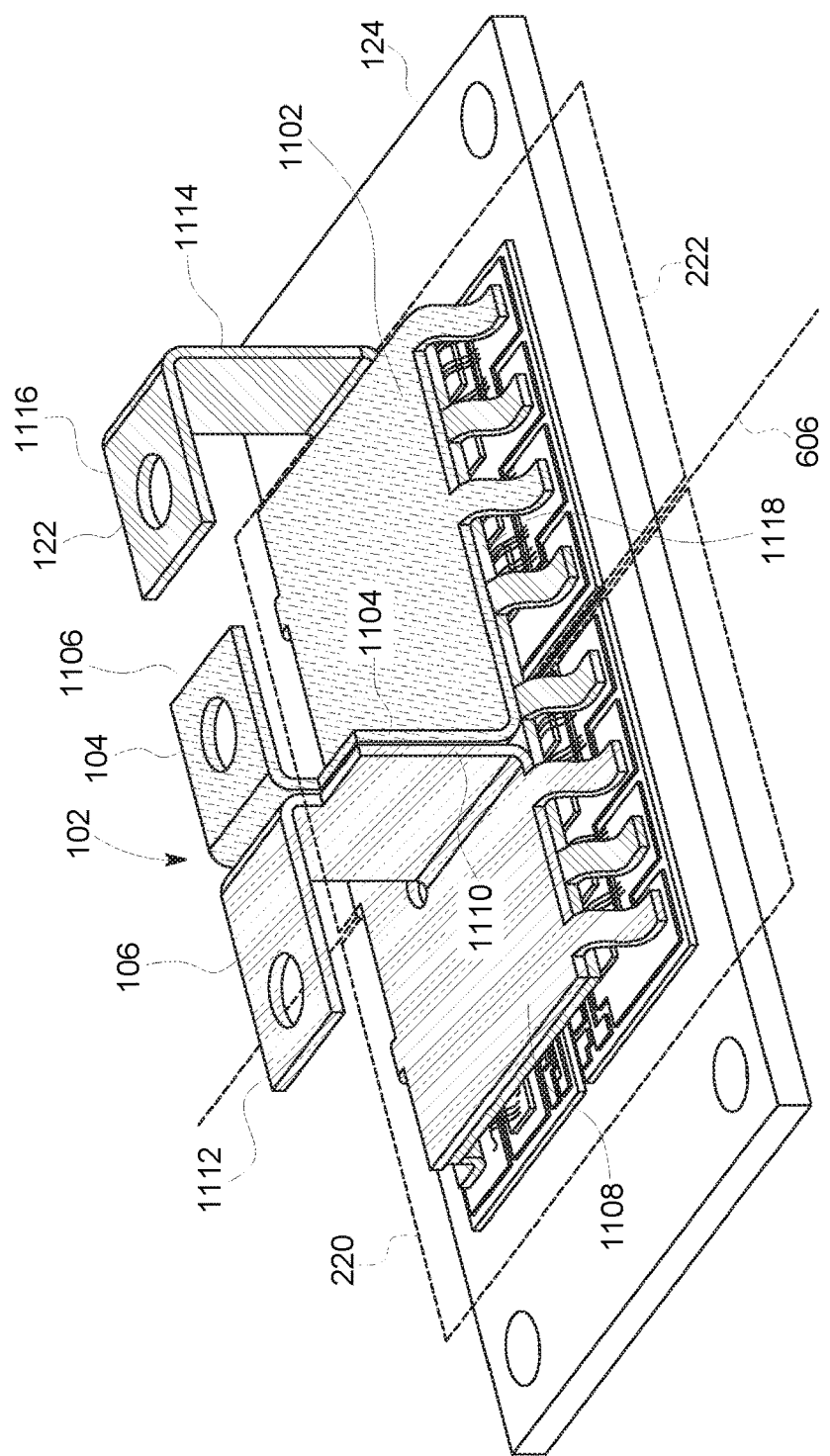
FIG. 11 depicts an embodiment of the inventive power module in accordance with some embodiments of the present invention.
Figure 12:
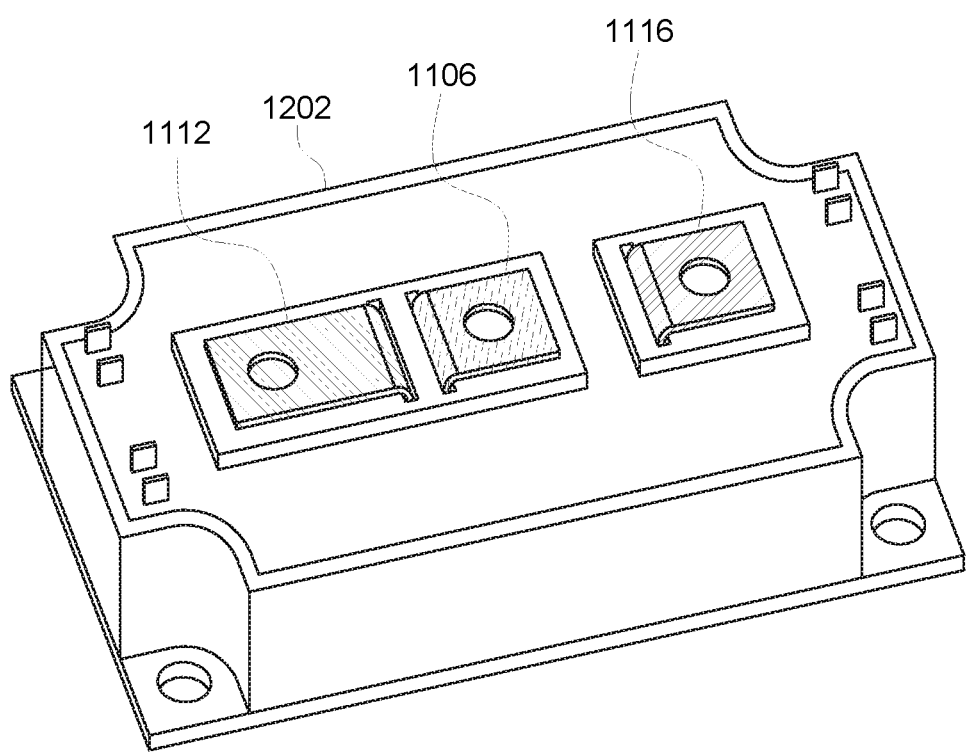
FIG. 12 depicts the power module shown in FIG. 11 with at least a portion of a housing suitable for use with the module.

FIG. 11 depicts an alternate embodiment of the power module in accordance with some embodiments of the present invention. In the embodiment depicted in FIG. 11, the positioning of the upper switch 220 and lower switch 222 and respective bus bar tab configuration is similar to that of FIGS. 6 and 7 (e.g., on opposing sides of the transversal axis 606).

In the embodiment illustrated, the first bus bar 104 and the second bus bar 106 may each include a first portion 1102, 1108 that is disposed in an orientation or direction similar to that of, or in some embodiments, substantially parallel or parallel to, the base 124 and a second portion 1104, 1110 coupled to the first portion 1102, 1108, wherein the second portion 1104, 1110 is disposed in an orientation or direction away, or in some embodiments, substantially perpendicular or perpendicular, to the first portion 1102, 1108. The first bus bar 104 and the second bus bar 106 may each further include a tab 1106, 1112 configured to be coupled to, for example, an input or output, that is disposed in an orientation similar to that of the first portion 1102, 1108.

In some embodiments, the third bus bar 122 may comprise a first portion 1118 that is disposed in an orientation or direction similar to that of, or in some embodiments, substantially parallel or parallel to, the base 124 and a second portion 1114 coupled to the first portion 1118, wherein the second portion 1114 is disposed in an orientation or direction away, or in some embodiments, substantially perpendicular or perpendicular, to the first portion 1118. The third bus bar 122 may further include a tab 1116 configured to be coupled to, for example, an input or output, that is disposed in an orientation similar to that of the first portion 1118.

Although shown in a particular configuration, any of the above described portions (e.g., portions 1102-1118) may be shaped in any manner suitable for a particular application. For example, in some embodiments, at least some of the portions are substantially flat or planar. Moreover, it is to be noted that, although shown having a particular placement across the respective bus bar, each of the portions 1102-1116 may be positioned or disposed with respect to one another in any manner suitable for a desired application.

The various configurations described in FIG. 11 may allow the power module 100 to be utilized within various housings, enclosure, packages or forms, or the like (e.g., such as the enclosures 1202) while maintaining the advantages of the inventive power module 100 as described herein.

Figure 13A:
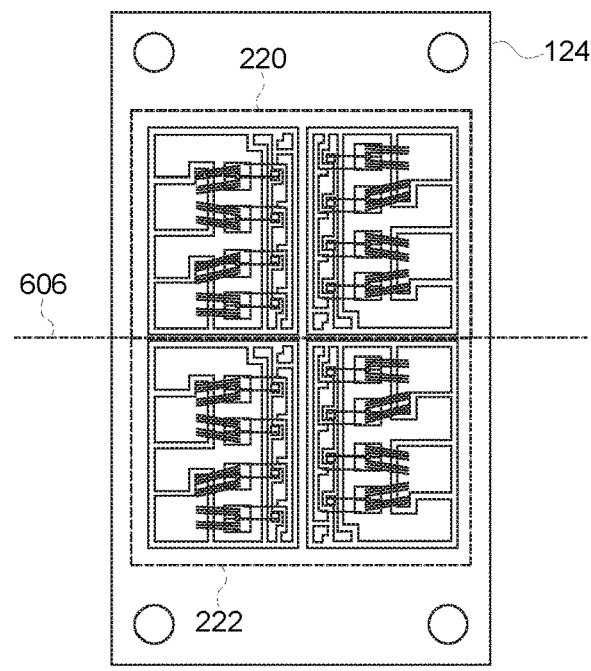
FIGS. 13A-D depict the power module shown in FIG. 11 in progressive stages of assembly.
Figure 13B:
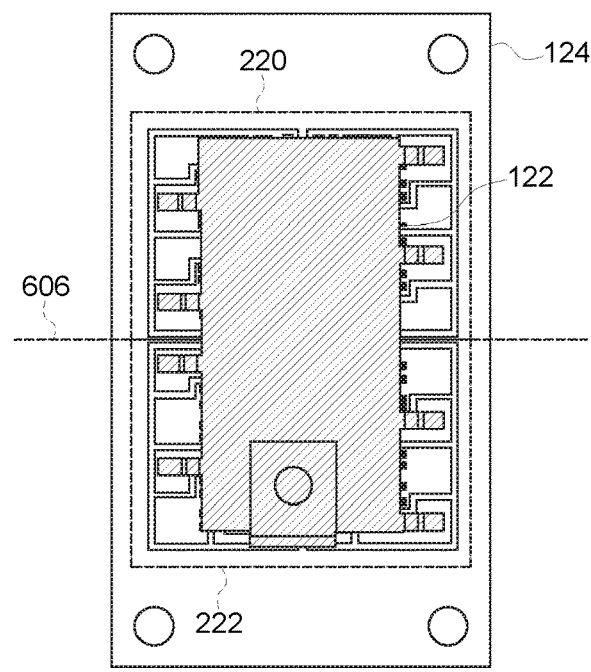
Figure 13C:
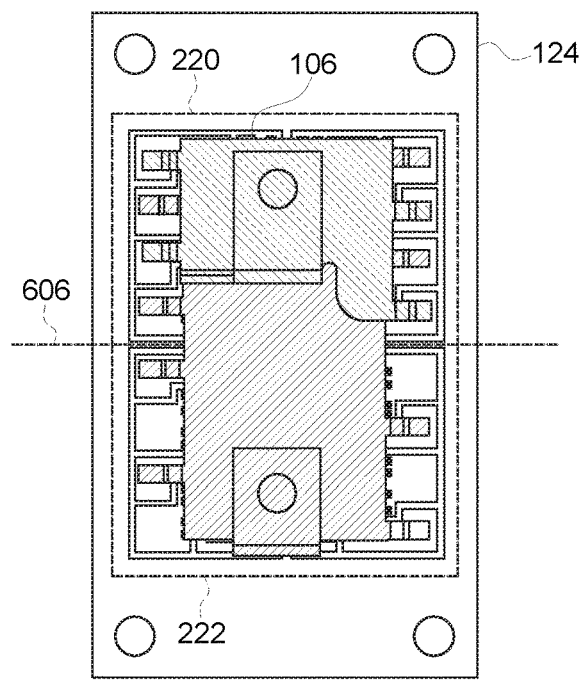
Figure 13D:
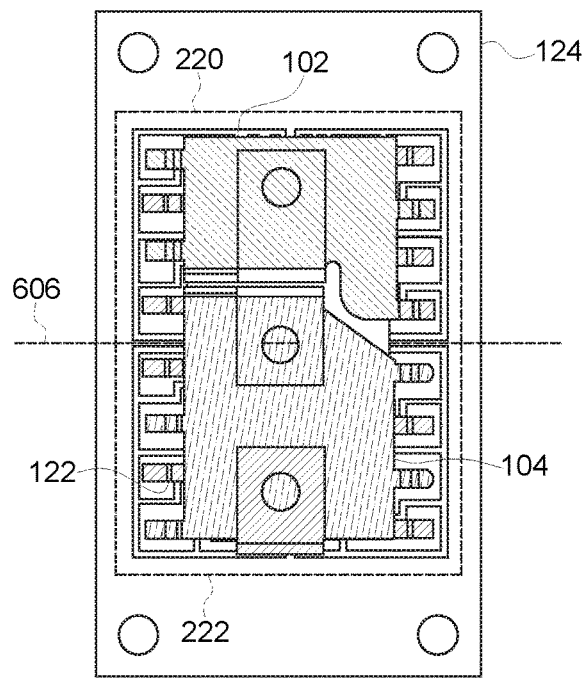

FIGS. 13A-D depict the power module shown in FIG. 11 in progressive fabrication stages and are provided to illustrate the relative placement of each of the base 124, upper switch 220, lower switch 222, first bus bar 104, second bus bar 106 and third bus bar 122 with respect to one another. Moreover, FIGS. 13A-D depict an embodiment of a sequence for at least partially assembling the module 100/bus bar structure 102. For example, as shown in FIGS. 13A-D, the third bus bar 122 may be first positioned atop the base 124 (FIG. 13B), the second bus bar 106 may then be positioned above the third bus bar 122 (FIG. 13C) and the first bus bar 104 may also be positioned above the third bus bar 122 and adjacent to the second bus bar 106 (FIG. 13D). The tabs of each of the respective bus bars 104, 106, 122 may be coupled to the traces at any time during the assembly of the module 100 (e.g., each bus bar may be coupled to the respective traces after placement of the bus bar or coupled to the traces after two or more of the bus bars are positioned). The tabs of each of the respective bus bars 104, 106, 122 may be coupled to the traces via any suitable process, for example, such as soldering, welding, brazing or the like.

Figure 14:
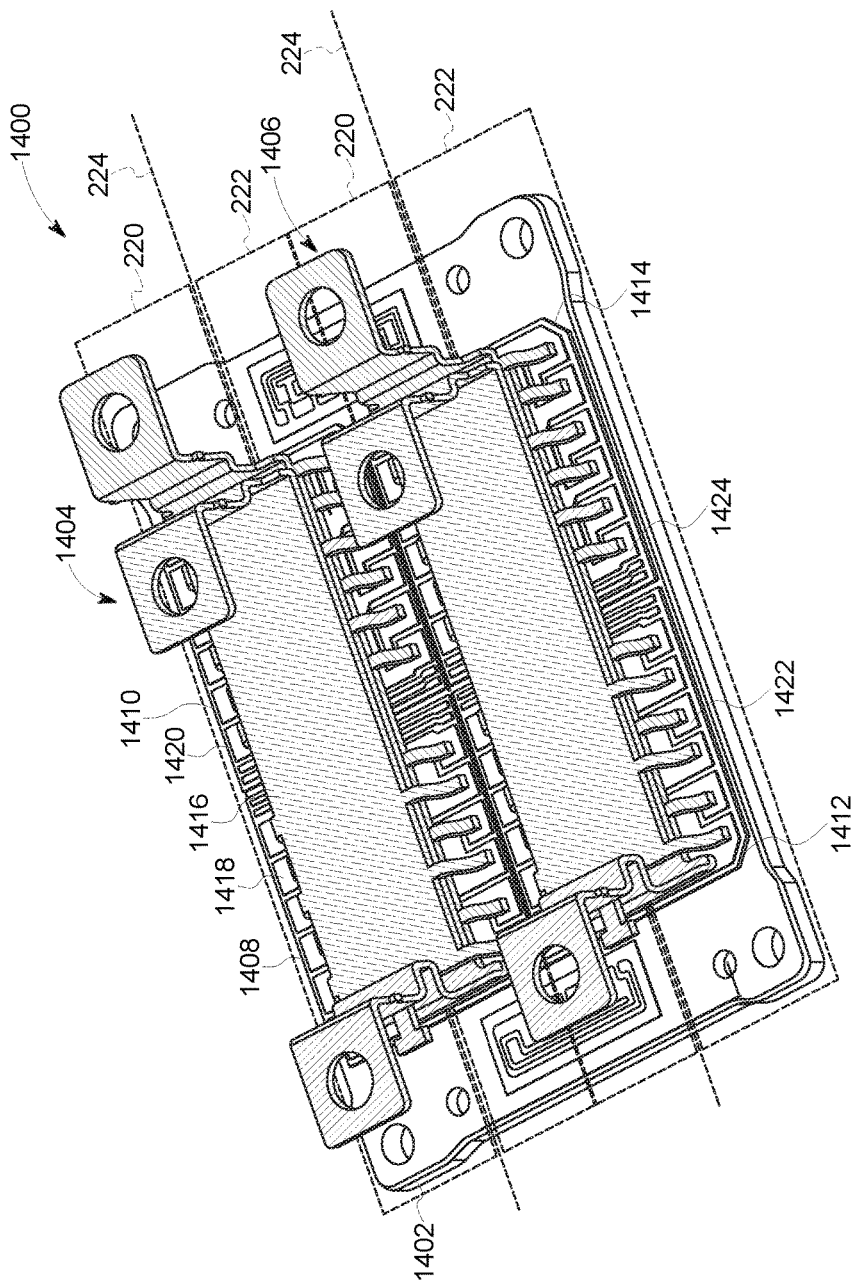
FIG. 14 depicts an embodiment of the inventive power module in accordance with some embodiments of the present invention.

Although shown in FIGS. 1-13 as having a single bus bar structure and respective substrates, conductive traces and semiconductor devices coupled thereto, the power module may have any number of bus bar structures and associated components suitable for a desired application. For example, FIG. 14 depicts an embodiment of the power module 1400 that comprises multiple components of the power module 1400 shown in FIGS. 1-13 supported by a common base 1402. In such embodiments the power module 1400 may include a plurality of upper and lower switches (two upper switches 220 and two lower switches 222, disposed on opposing sides of a respective longitudinal axes 224 shown), a plurality of bus bar structures (first bus bar structure 1404 and second bus bar structure 1406 shown) and a plurality of substrates (four substrates 1408, 1410, 1412 and 1414 shown) having conductive traces 1418, 1420, 1422, 1424 formed thereon, wherein the bus bar structures 1404, 1406 are coupled to the conductive traces 1418, 1420, 1422, 1424 of the respective plurality of substrates 1408, 1410, 1412 and 1414. In such embodiments, the plurality of substrates 1408, 1410, 1412, 1414 may be supported by a single base 1402. The substrates 1408, 1410, 1412 and 1414 may further include a plurality of semiconductor devices coupled to the one or more conductive traces 130 either directly or via wire bonds, and a plurality of respective gate connectors for the plurality of semiconductor devices (although obscured from view in FIG. 14, the semiconductor devices gate connectors, and wire bonds may be similar to those shown in FIG. 2). Although not shown, additional components known in the art that are suitable for operation of the gate connectors with respect to the semiconductor devices for example, electrical couplings or connectors, gate resistors, or the like, may also be present.

The inventors have observed that the bus bar configurations as provided herein provides a more compact bus bar structure as compared to conventional bus bar configurations, thereby allowing for the above described additional bus bars structures, substrates and semiconductor devices to be included in the power module that would otherwise not be possible due to space constraints. In one exemplary embodiment, the number of components may be increased by a factor of two, for example from 1 bus bar structure and 24 semiconductor devices (e.g., as shown in FIG. 1) to two bus bar structures and 48 semiconductor devices (e.g., as shown in FIG. 14). The addition of bus bar structures, substrates and semiconductor devices allows for an increase of capability and performance without increasing the overall dimensions or footprint of the power module.

Each of the components (e.g., bus bar structure 1404, 1406, substrates 1408, 1410, 1412 and 1414, conductive traces 1418, 1420, 1422, 1424, semiconductor devices 1426, 1428, 1430, 1432, or the like) of the power module 1400 shown in FIG. 14 may include any of the embodiments of the corresponding components described above with respect to FIGS. 1-13. In operation, each of the bus bar structures 1404, 1406, in combination with the respective conductive traces 1418, 1420, 1422, 1424, plurality of substrates 1408, 1410, 1412 and 1414 and semiconductor devices 1426, 1428, 1430, 1432 may independently form a current flow path similar to the current flow path described above with respect to FIGS. 3-4.

Figure 15:
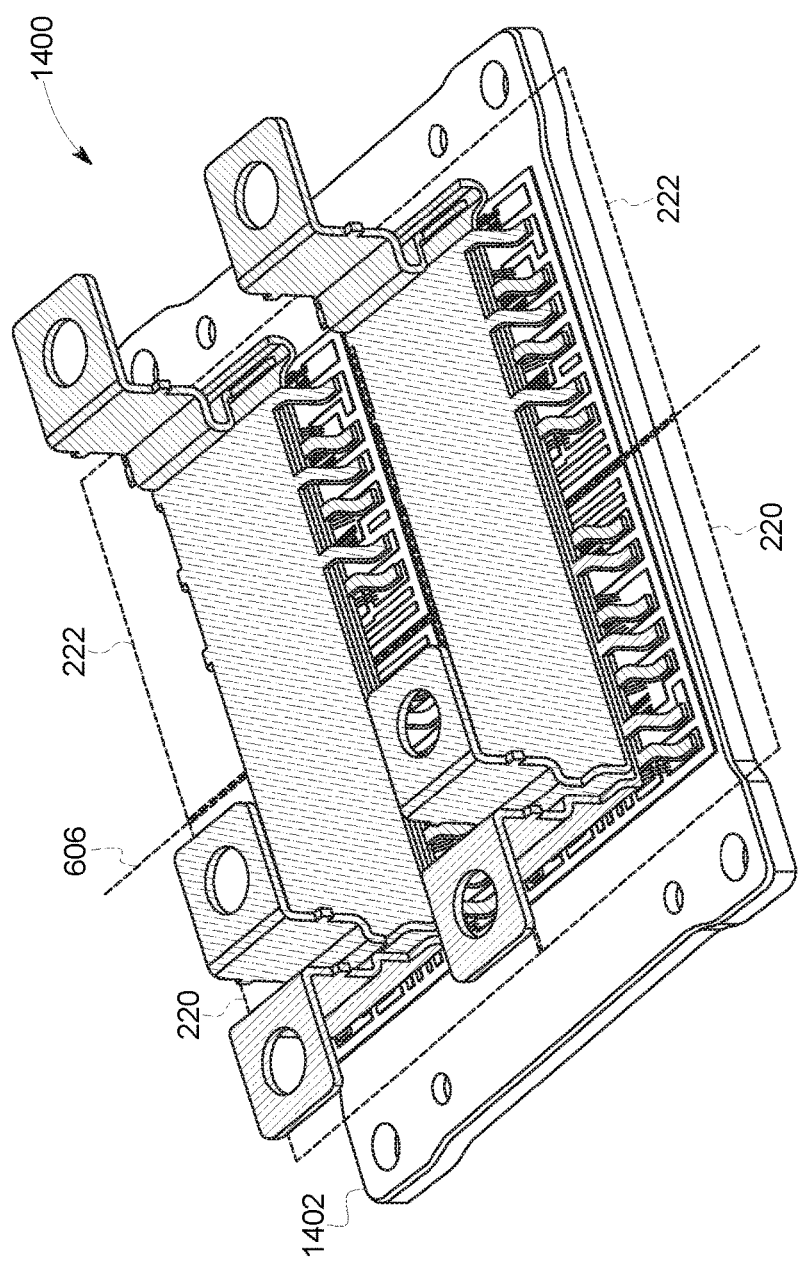
FIG. 15 depicts an embodiment of the inventive power module in accordance with some embodiments of the present invention.

As noted above, in any of the embodiments described herein, the upper switch 220 and the lower switch 222 may be disposed about the substrates 126, 128 in any manner suitable for a desired application and such disposition may be dependent on desired power module operating parameters, spatial constraints, bus bar placement, or the like. For example, FIG. 15 depicts an embodiment of the power module 1400 having a configuration similar to that of the power module 1400 depicted in FIG. 14. However, in the embodiment shown in FIG. 15 the upper switch 220 and lower switch 222 are configured similar to that of the embodiments described above with respect to FIGS. 6 and 7 (e.g., the upper switch 220 and lower switch 222 may be disposed on opposing sides of a transversal axis 606).

Figure 16A:
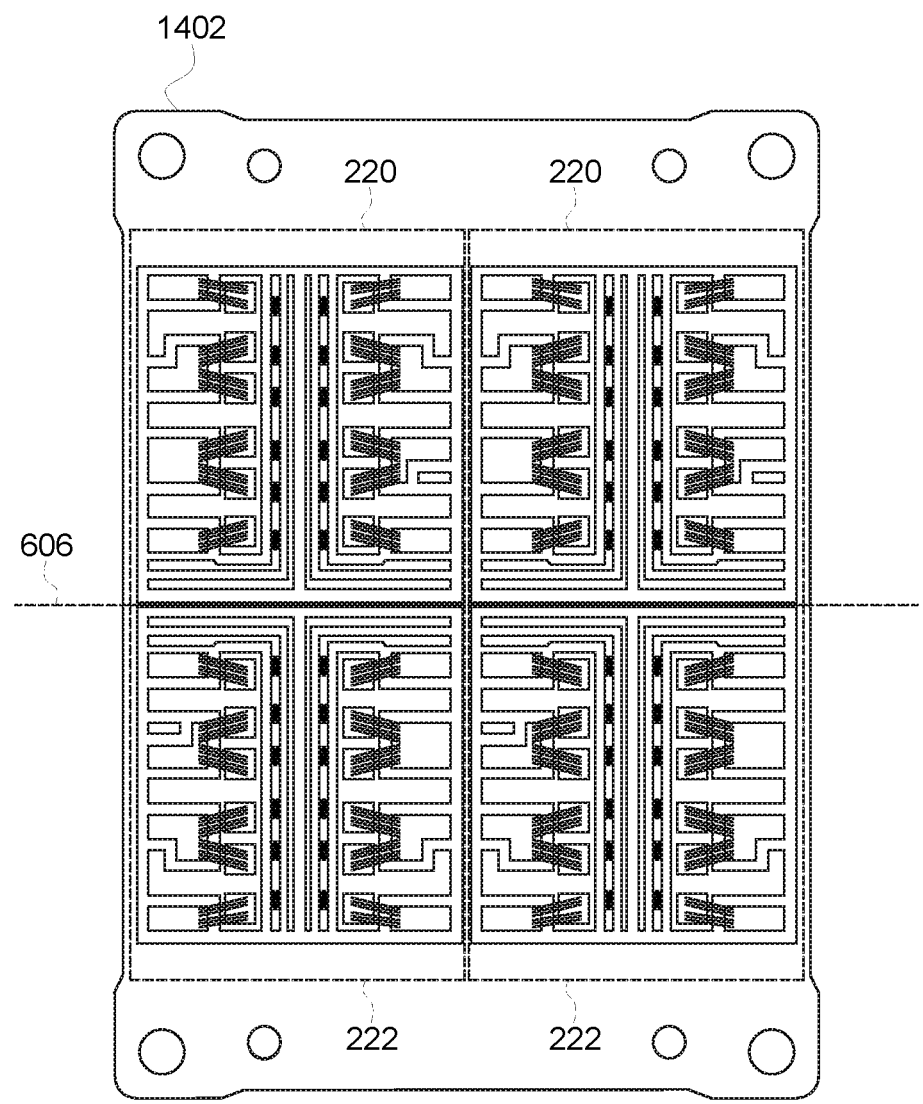
FIGS. 16A-D depict the power module shown in FIG. 15 in progressive stages of assembly.
Figure 16B:
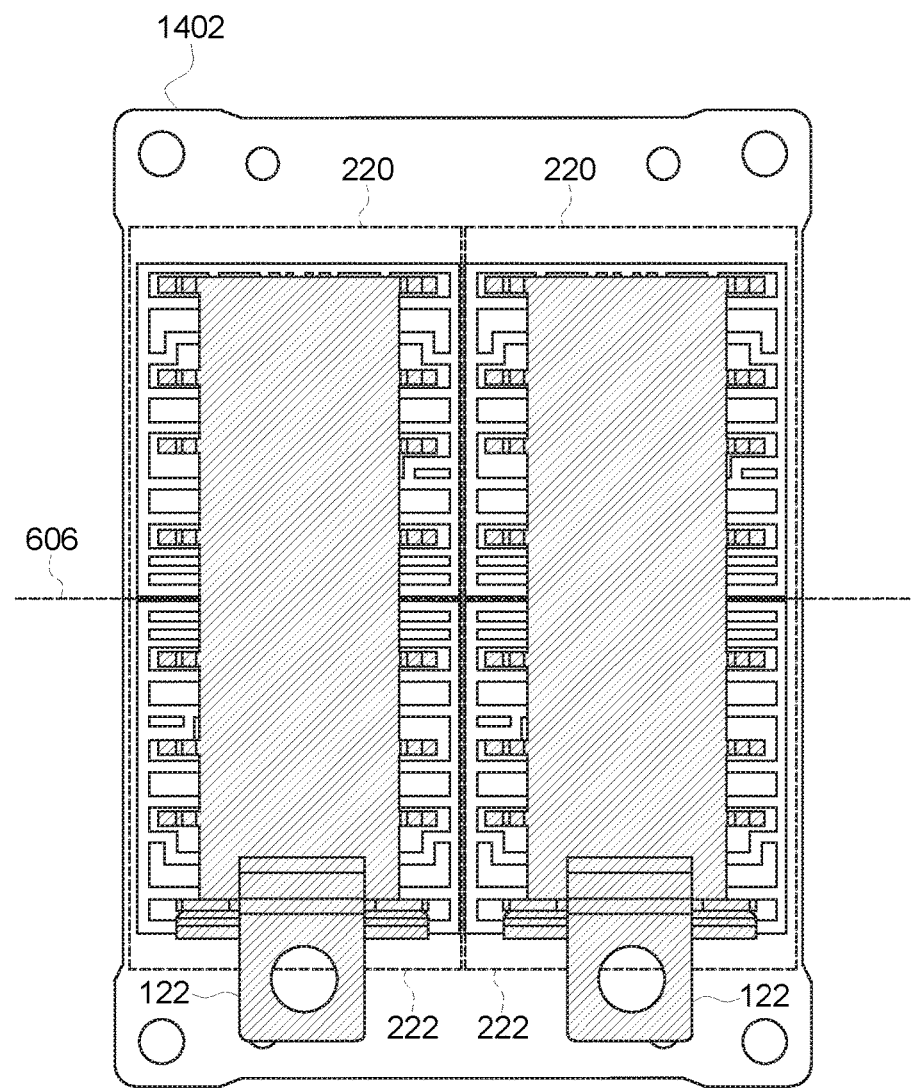
Figure 16C:
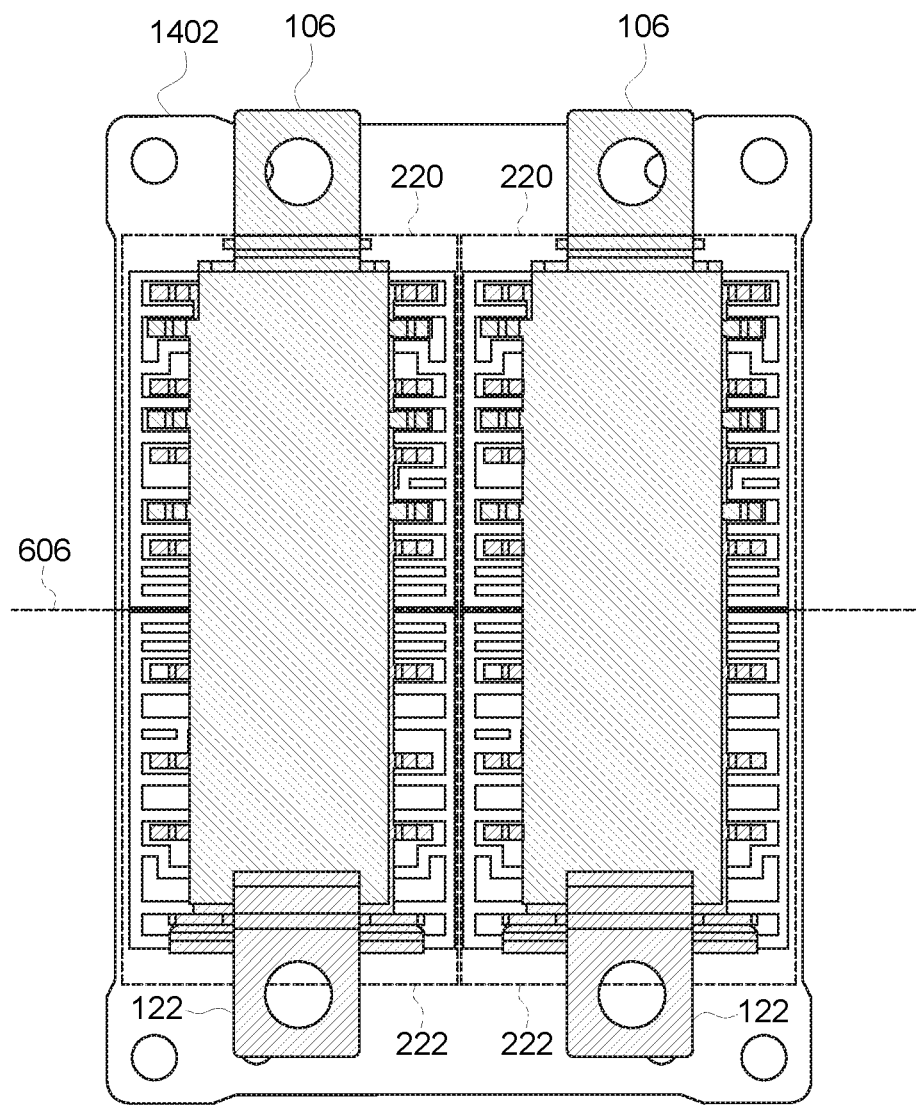
Figure 16D:
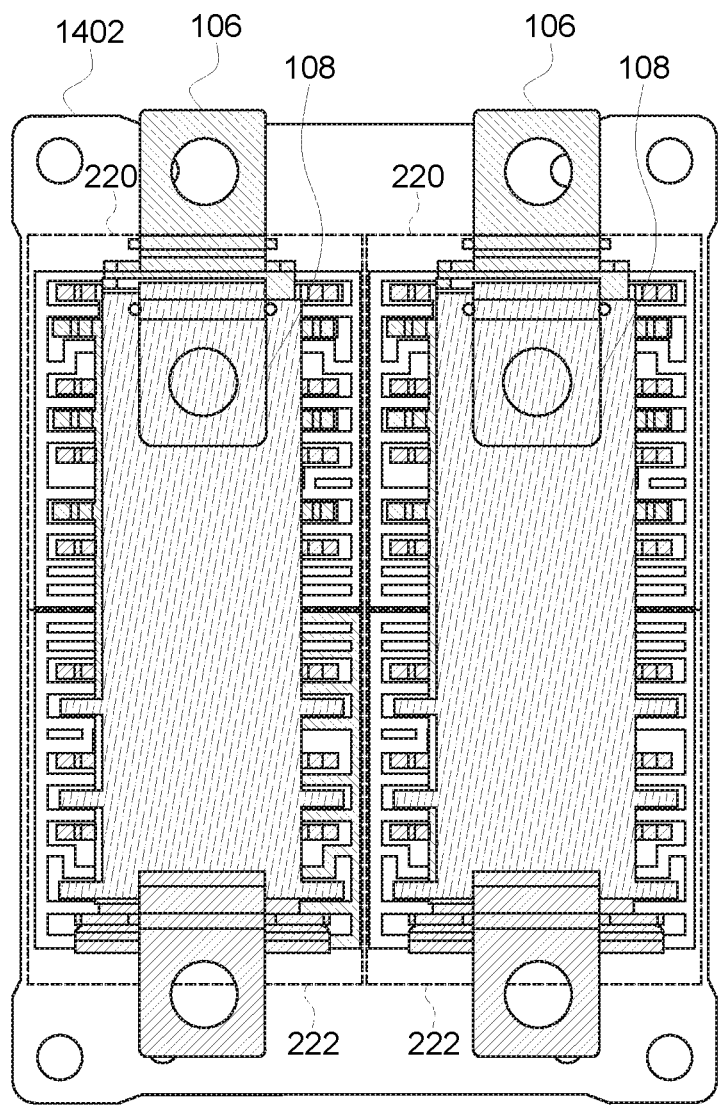

FIGS. 16A-D depict the power module shown in FIG. 15 in progressive fabrication stages and are provided to illustrate the relative placement of each of the base 802, upper switch 220, lower switch 222, first bus bar 104, second bus bar 106 and third bus bar 122 with respect to one another. Moreover, FIGS. 16A-D depict an embodiment of a sequence for at least partially assembling the module 100/bus bar structure 102. For example, as shown in FIGS. 16A-D, the third bus bar 122 may be first positioned atop the base 124 (FIG. 16B), the second bus bar 106 may then be positioned above the third bus bar 122 (FIG. 16C) and the first bus bar 104 may then be positioned above the second bus bar 106 (FIG. 16D). The tabs of each of the respective bus bars 104, 106, 122 may be coupled to the traces at any time during the assembly of the module 100 (e.g., each bus bar may be coupled to the respective traces after placement of the bus bar or coupled to the traces after two or more of the bus bars are positioned). The tabs of each of the respective bus bars 104, 106, 122 may be coupled to the traces via any suitable process, for example, such as soldering, welding, brazing or the like.

Although the power module is depicted in FIGS. 1-16 as having one bus bar structure coupled to a respective set of upper and lower semiconductor devices (e.g., upper switch 220 and lower switch 222), in some embodiments, the power module may comprise a single bus bar structure that is configured to be coupled to multiple groups of semiconductor devices. For example, referring to FIG. 17, in some embodiments, the power module 1700 may comprise a single bus bar structure 1702 coupled to a plurality of substrates via a plurality of conductive traces, wherein each of the plurality of substrates comprises multiple groups of semiconductor devices (described below with respect to FIG. 18).

Figure 17:
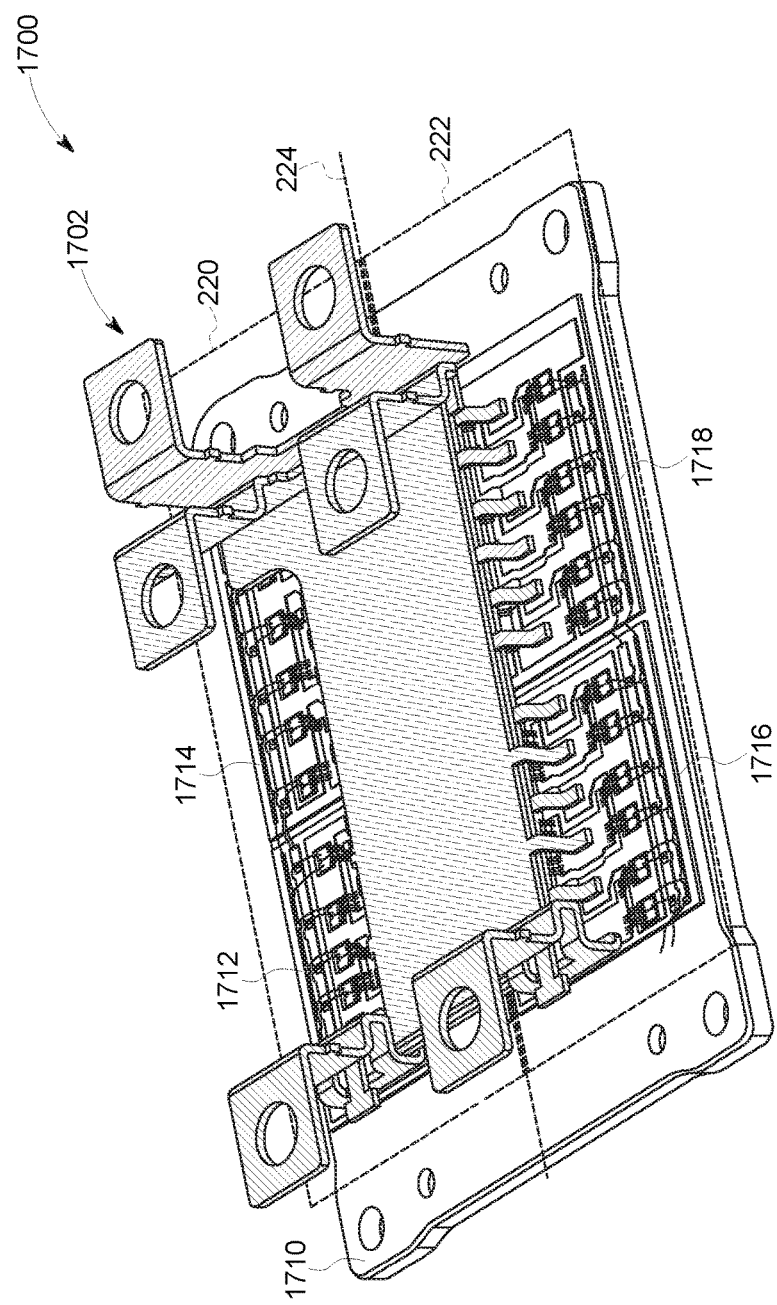
FIG. 17 depicts an embodiment of the inventive power module in accordance with some embodiments of the present invention.
Figure 18:
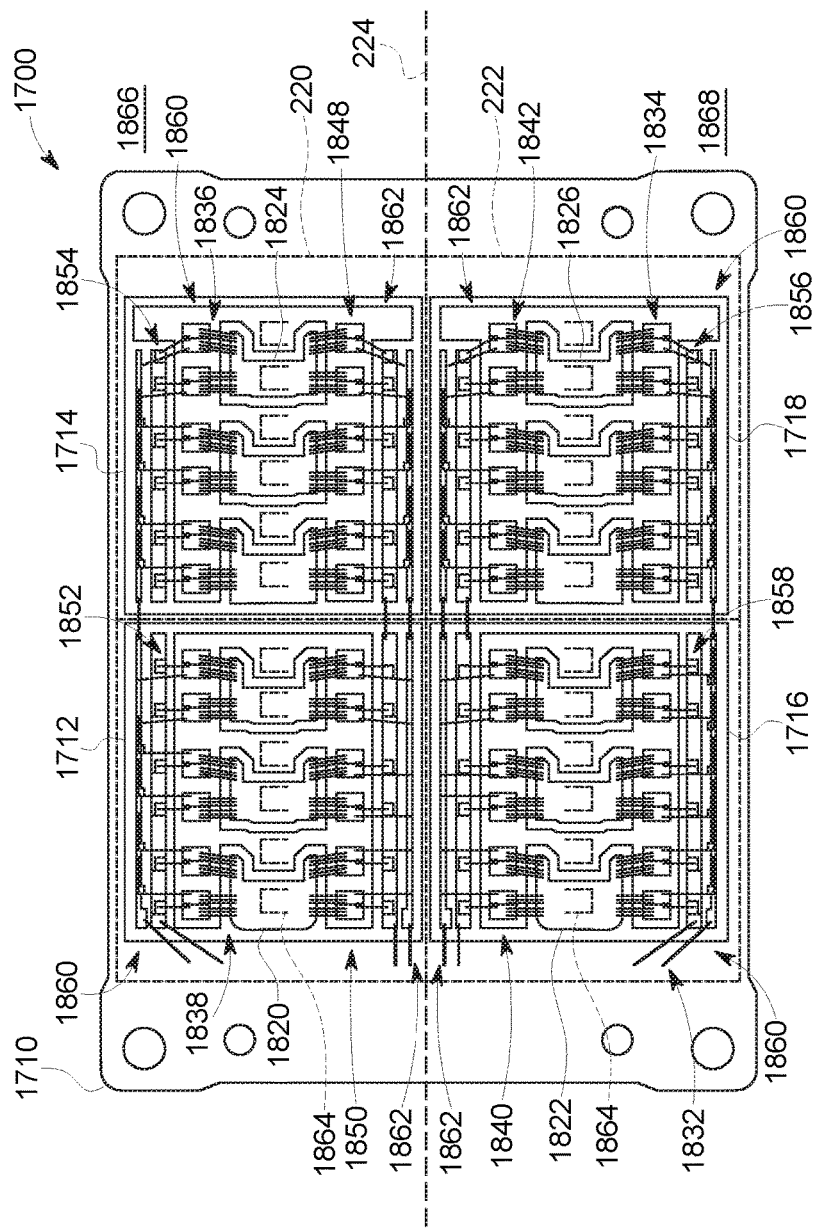
FIG. 18 is a portion of the power module shown in FIG. 17.

For clarity, FIG. 18 depicts the power module 1700 of FIG. 17, however with the bus bar structure 1702 removed such that the underlying components are visible. As shown in FIG. 18, the plurality of substrates (four substrates 1712, 1714, 1716, 1718 shown) each comprise a plurality of conductive traces 1820, 1822, 1824, 1826. In some embodiments, each of the substrates 1712, 1714, 1716, 1718 may further include a first group of semiconductor devices 1832, 1834, 1836, 1838 and a second group of semiconductor devices 1840, 1842, 1848, 1850 coupled to the one or more conductive traces 1820, 1822, 1824, 1826.

The first group of semiconductor devices 1832, 1834, 1836, 1838 and the second group of semiconductor devices 1840, 1842, 1848, 1850 may be arranged in any manner suitable to provide a desired performance of the power module 1700. For example, in some embodiments, the first group of semiconductor devices 1832, 1834, 1836, 1838 may be disposed on a first side 1860 of each of the substrates 1712, 1714, 1716, 1718 and the second group of semiconductor devices 1844, 1846, 1848, 1850 disposed on an opposing second side 1862 of each of the substrates 1712, 1714, 1716, 1718. In such embodiments, the first group of semiconductor devices 1832, 1834, 1836, 1838 and the second group of semiconductor devices 1840, 1842, 1848, 1850 may be symmetrically disposed with respect to one another about the substrates 1712, 1714, 1716, 1718.

In configurations where a single bus bar structure is configured to be coupled to multiple groups of semiconductor devices, such as shown in FIG. 18, multiple groups of semiconductor devices may collectively form each of the upper and lower switches. For example, in some embodiments, semiconductor devices of the first group and second group of semiconductor devices disposed on a first side 1866 of the transversal axis 224 (e.g., semiconductor devices 1836, 1838, 1848, 1850) may form the upper switch 220 and semiconductor devices of the first group and second group disposed on a second side 1868 of the transversal axis 224 (e.g., semiconductor devices 1832, 1834, 1840, 1842) may form the lower switch 222.

The bus bar structure 1702 may be disposed in any manner suitable to provide a desired performance of the power module 1700. In some embodiments, the bus bar structure 1702 may be positioned such that tabs of the DC bus bars (e.g., first bus bar 104 (DC− bus bar) and second bus bar 105 (DC+ bus bar described above) are coupled to portions of conductive traces 1820, 1822, 1824, 1826 disposed directly between respective ones or pairs of semiconductor devices from the first group of semiconductor devices 1832, 1834, 1836, 1838 and semiconductor devices of the second group of semiconductor devices 1840, 1842, 1848, 1850 (placement of the DC bus bar tabs shown in phantom at 1864). Similarly, the tabs of the AC bus bar are coupled to conductive traces 1820, 1822, 1824, 1826 adjacent and alternating with the conductive traces 1820, 1822, 1824, 1826 having the DC bus bar tabs coupled thereto (placement of the AC bus bar tabs shown in phantom at 1848). In such embodiments, gate connectors 1852, 1854, 1856, 1858 and related components (not shown) may be disposed outward of the semiconductor devices on each substrate 1812, 1814, 1816, 1818 (e.g., as opposed to inward such as shown in FIG. 1-16).

Each of the components (e.g., bus bar structure 1702, substrates 1712, 1714, 1716 and 1718, conductive traces 1820, 1822, 1824, 1826, gate connectors 1852, 1854, 1856, 1858 semiconductor devices or the like) of the power module 1700 shown in FIGS. 17-18 may include any of the embodiments of the corresponding components described above with respect to FIGS. 1-16.

Figure 19:
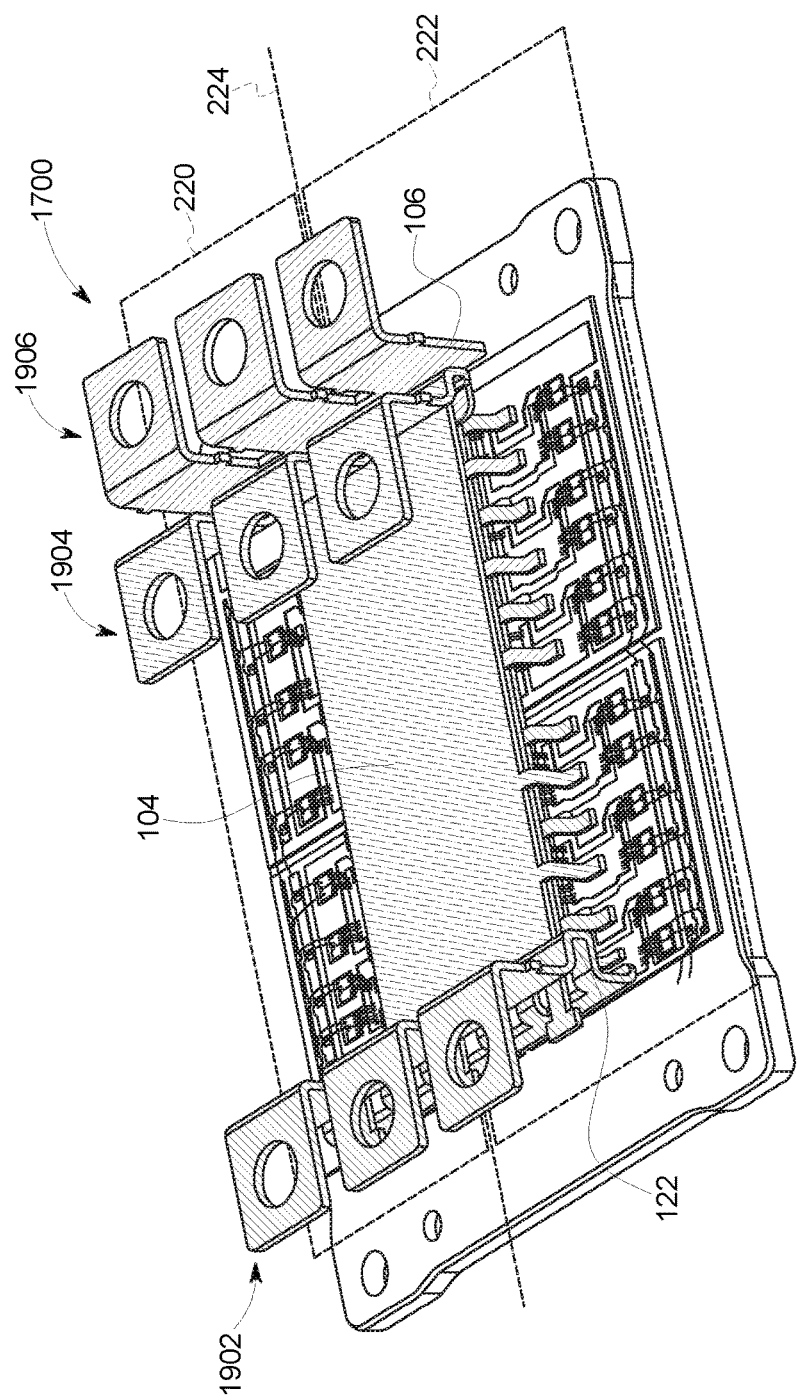
FIG. 19 depicts an embodiment of the inventive power module in accordance with some embodiments of the present invention.
Figure 20:
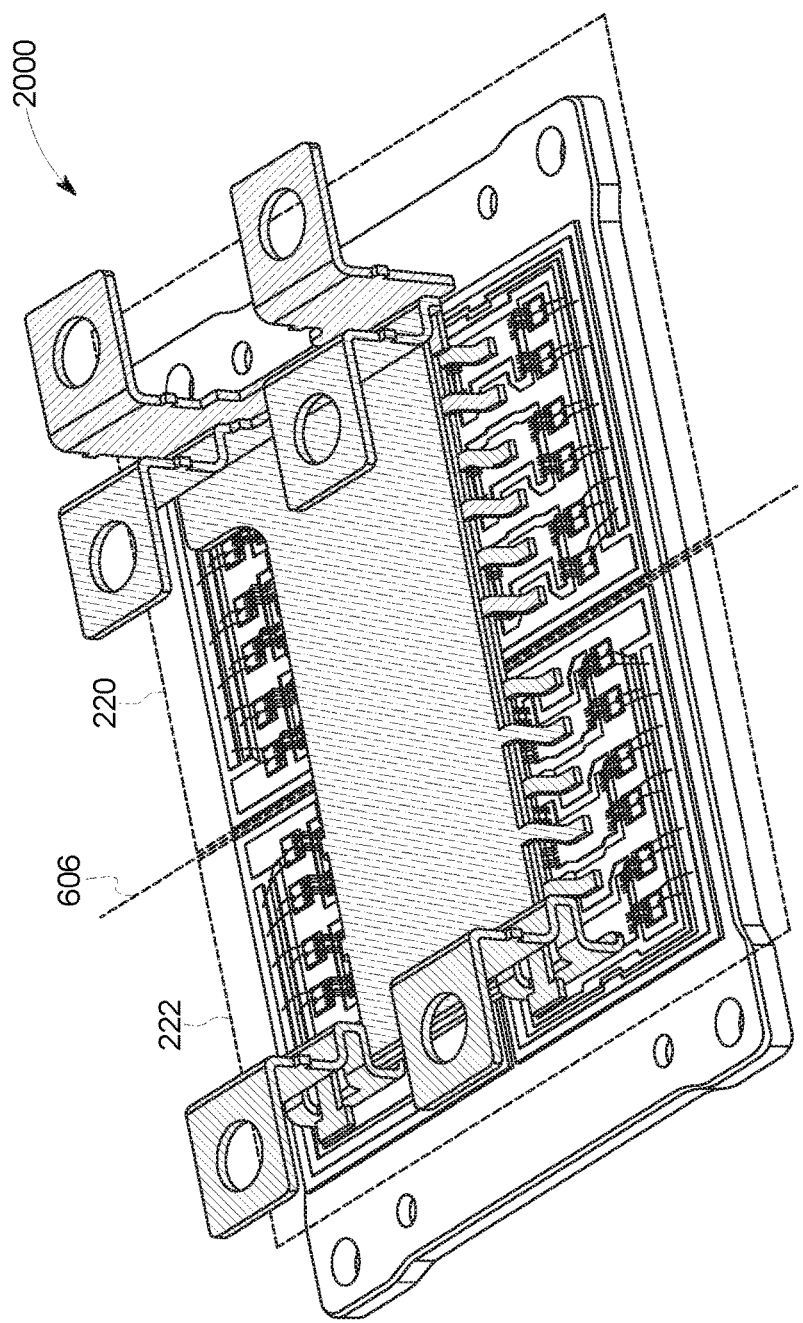
FIG. 20 depicts an embodiment of the inventive power module in accordance with some embodiments of the present invention.

Although described above in the above embodiments as having one or two input/output tabs (terminals), each bus bar of the bus bar structure may have any number of tabs as needed to accommodate operating parameters (e.g., current) for a desired application. For example, FIG. 19 depicts a bus bar structure similar to the bar structure 1700 shown in FIG. 17, however with each bus bar 104, 106, 122 of the bus bar structure 1700 having three input/output tabs (tabs indicated at 1902, 1904, 1906). FIG. 20 depicts an embodiment of the power module 2000 having a configuration similar to that of the power module 1700 depicted in FIG. 17. However, in the embodiment shown the upper switch 220 and lower switch 222 are configured similar to that of the embodiments described above with respect to FIGS. 6 and 7 (e.g., the upper switch 220 and lower switch 222 may be disposed on opposing sides of the transversal axis 606.

Figure 21A:
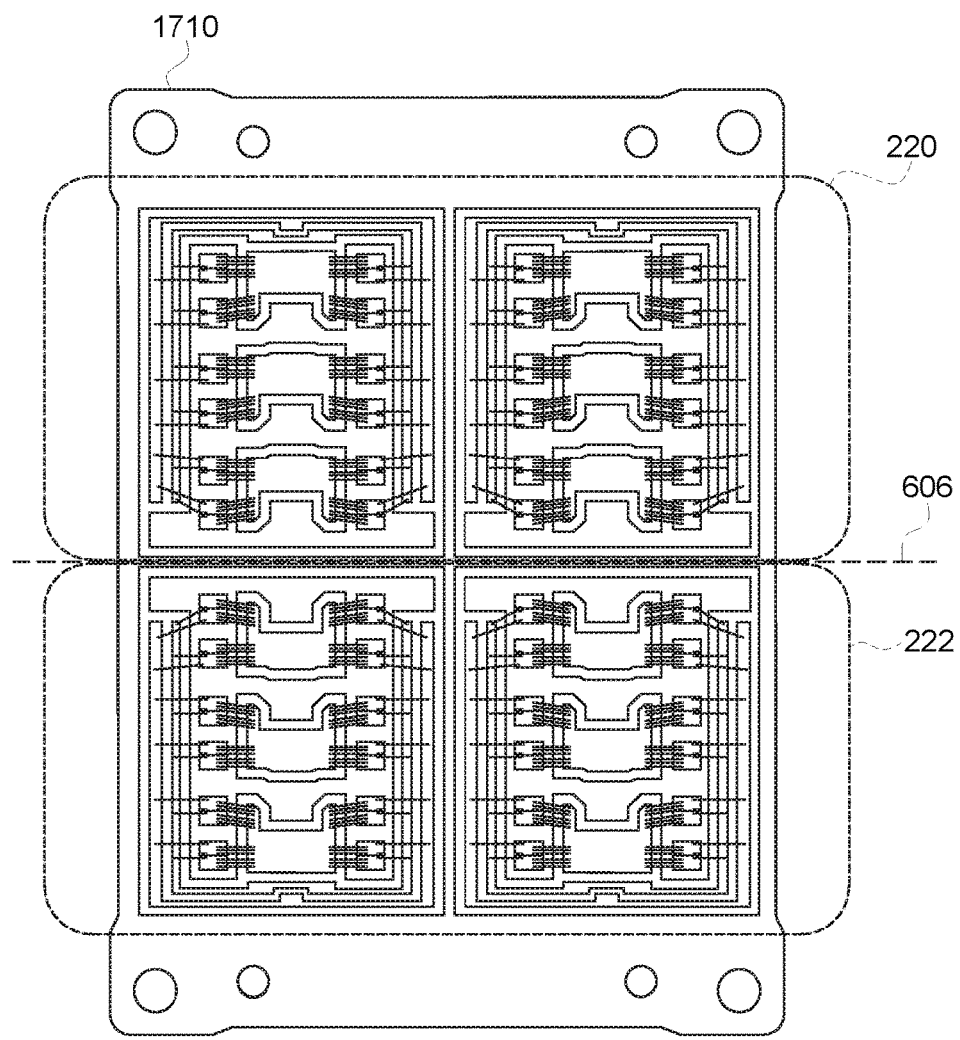
FIGS. 21A-D depict the power module shown in FIG. 20 in progressive stages of assembly.
Figure 21B:
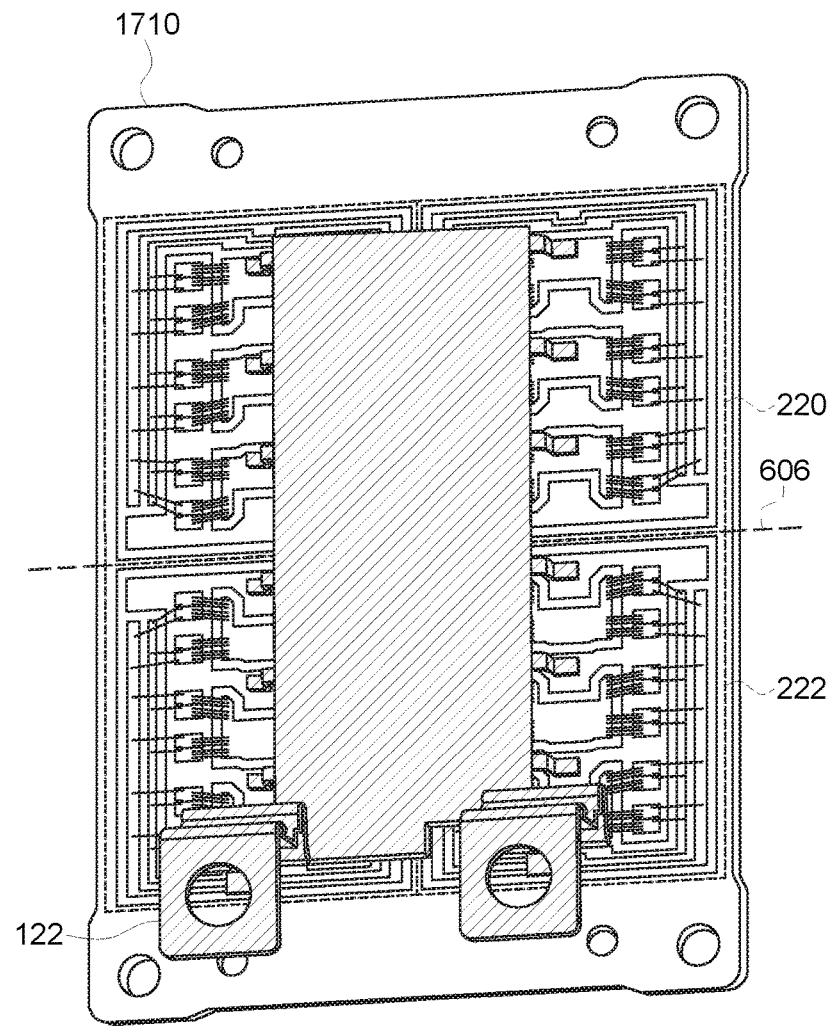
Figure 21C:
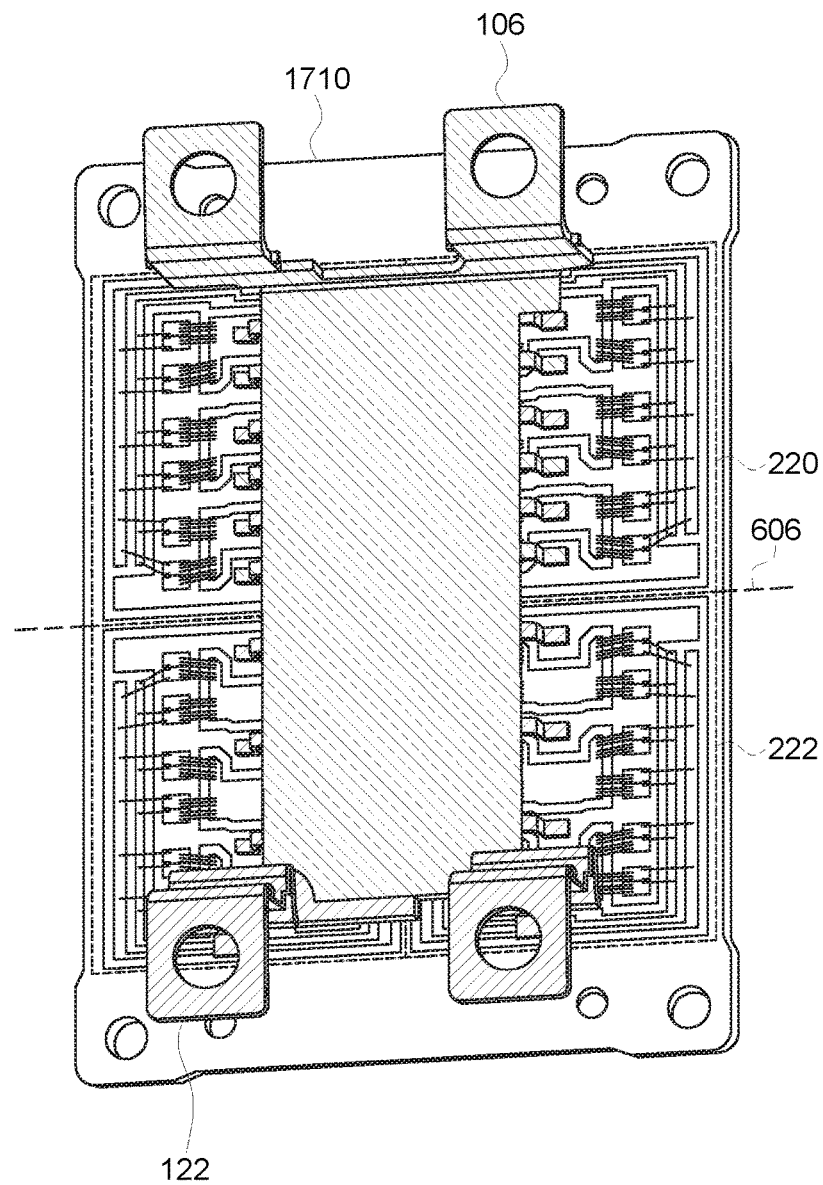
Figure 21D:
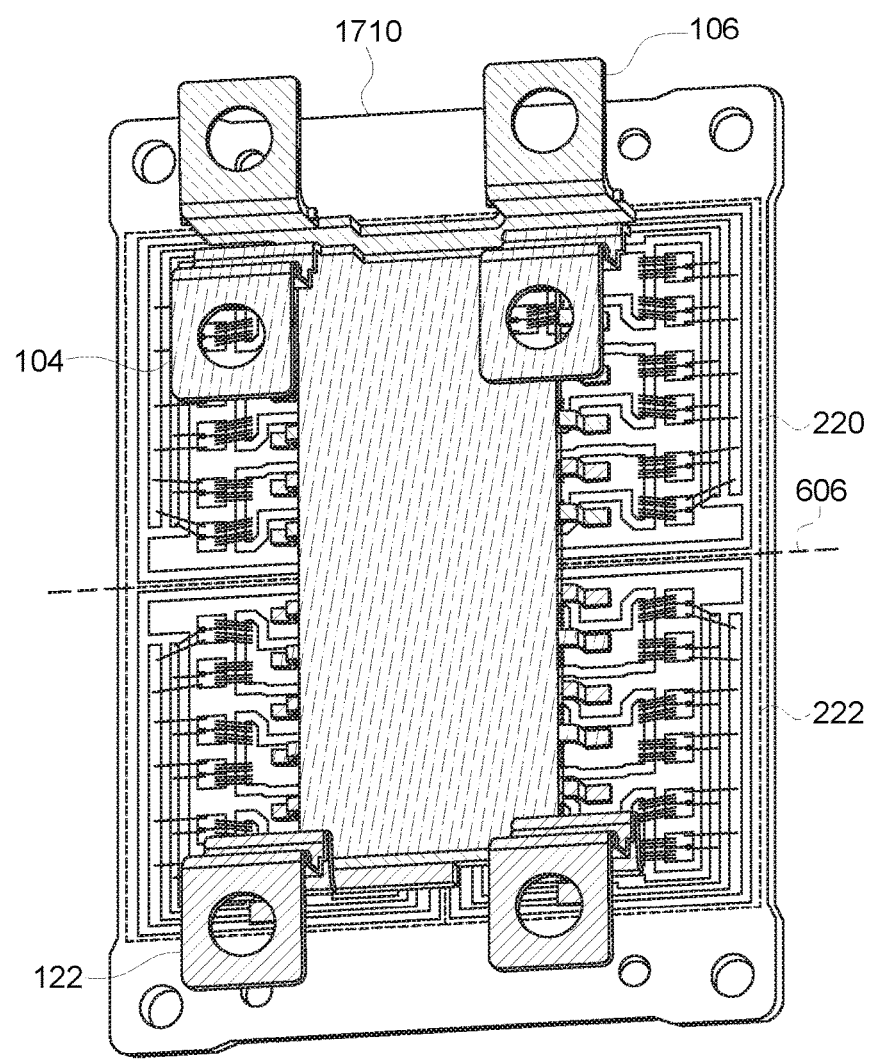

FIGS. 21A-D depict the power module shown in FIG. 20 in progressive fabrication stages and are provided to illustrate the relative placement of each of the base 1710, upper switch 220, lower switch 222, first bus bar 104, second bus bar 106 and third bus bar 122 with respect to one another. Moreover, FIGS. 21A-D depict an embodiment of a sequence for at least partially assembling the module 100/bus bar structure 102. For example, as shown in FIGS. 21A-D, the third bus bar 122 may be first positioned atop the base 1710 (FIG. 21B), the second bus bar 106 may then be positioned above the third bus bar 122 (FIG. 21C) and the first bus bar 104 may then be positioned above the second bus bar 106 (FIG. 21D). The tabs of each of the respective bus bars 104, 106, 122 may be coupled to the traces at any time during the assembly of the module 100 (e.g., each bus bar may be coupled to the respective traces after placement of the bus bar or coupled to the traces after two or more of the bus bars are positioned). The tabs of each of the respective bus bars 104, 106, 122 may be coupled to the traces via any suitable process, for example, such as soldering, welding, brazing or the like.

FIGS. 22 and 23A-C depict an embodiment and related exploded view of the power module 2200 having a configuration similar to that of the power module 2000 depicted in FIG. 20. However, in the embodiment shown in FIGS. 22 and 23A-C each of the first bus bar 104, second bus bar 106 and third bus bar 122 comprise three input/output tabs (indicated at 2202, 2204, 2206) as opposed to the two input/output tabs shown in FIG. 20.

Figure 22:
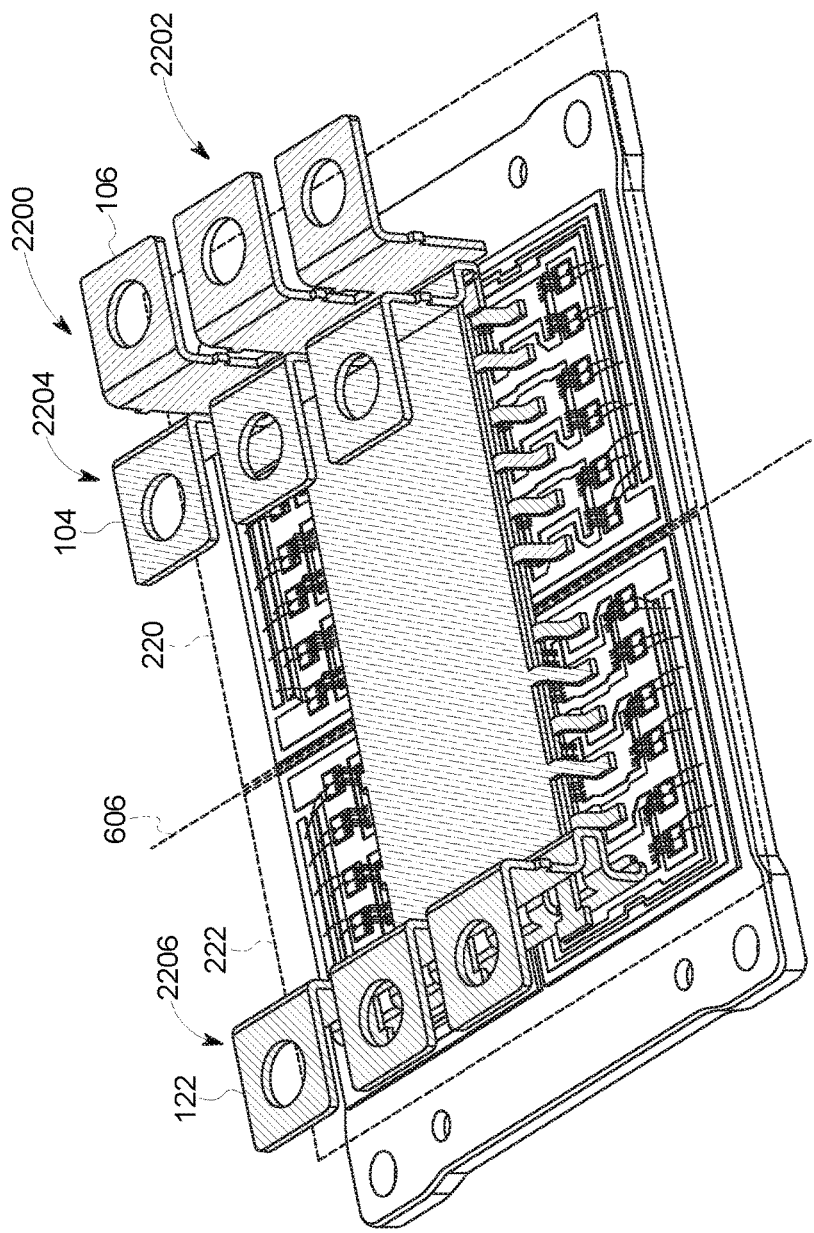
FIG. 22 depicts an embodiment of the inventive power module in accordance with some embodiments of the present invention.
Figure 23A:
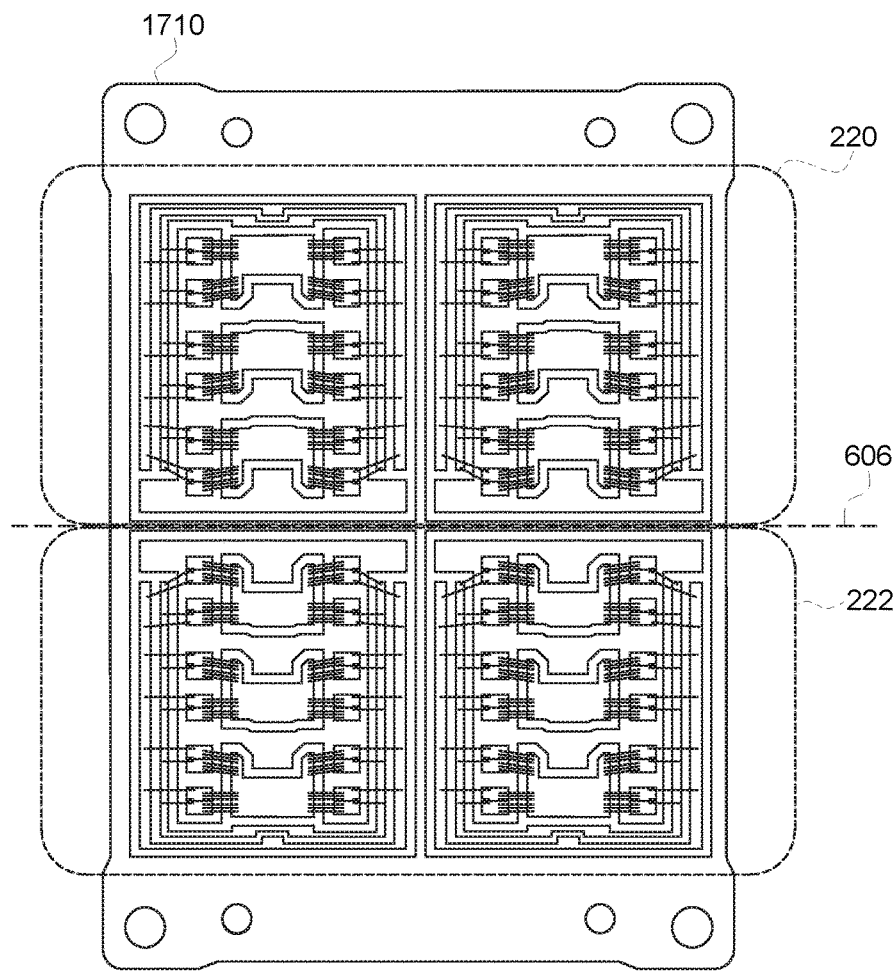
FIGS. 23A-D depict the power module shown in FIG. 22 in progressive stages of assembly.
Figure 23B:
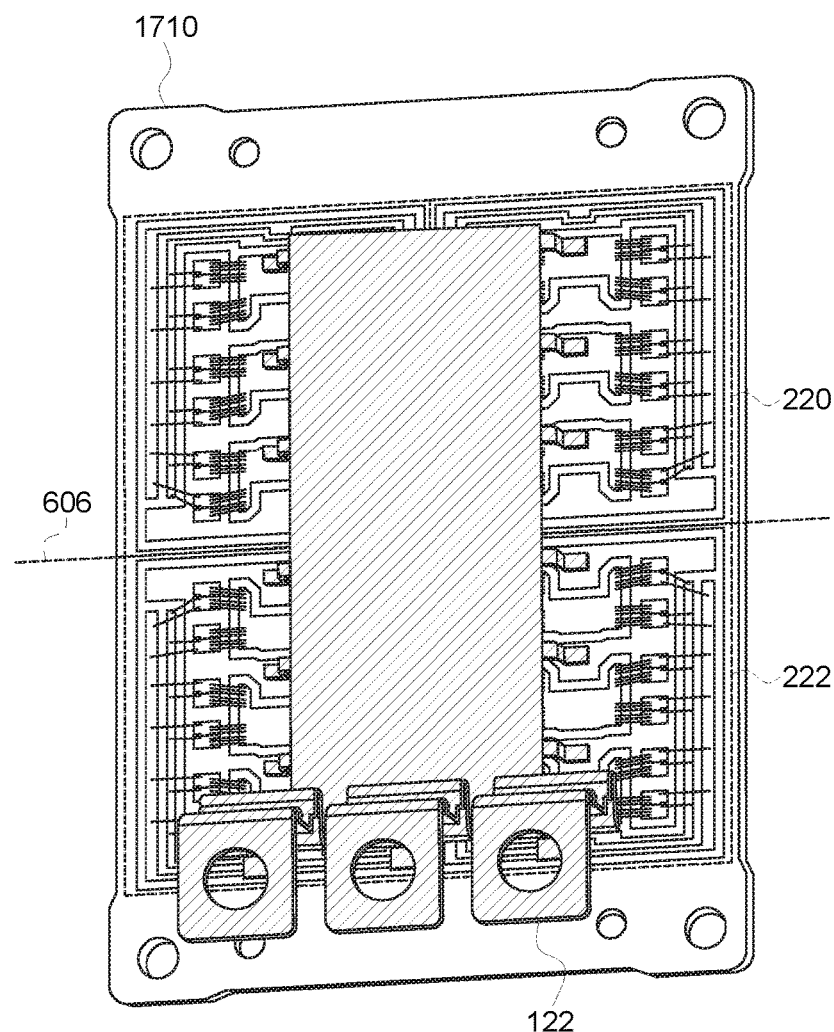
Figure 23C:
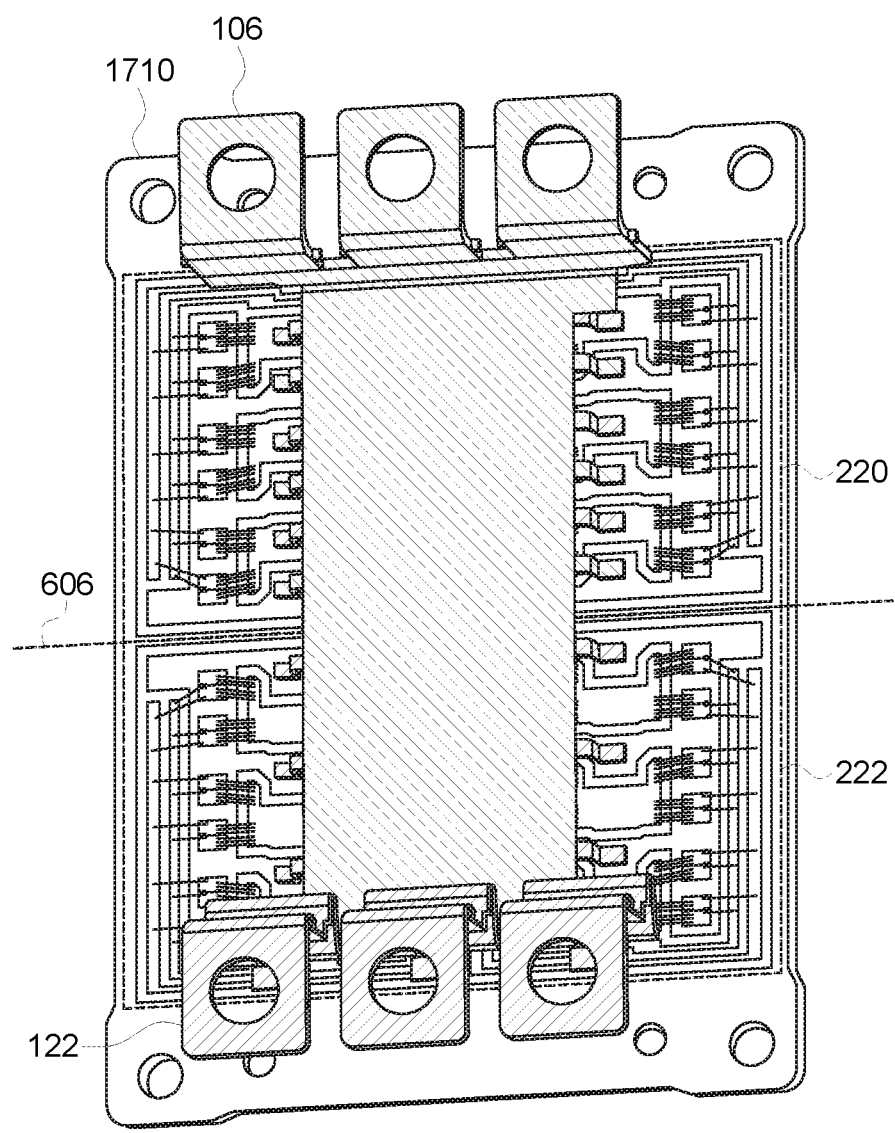
Figure 23D:
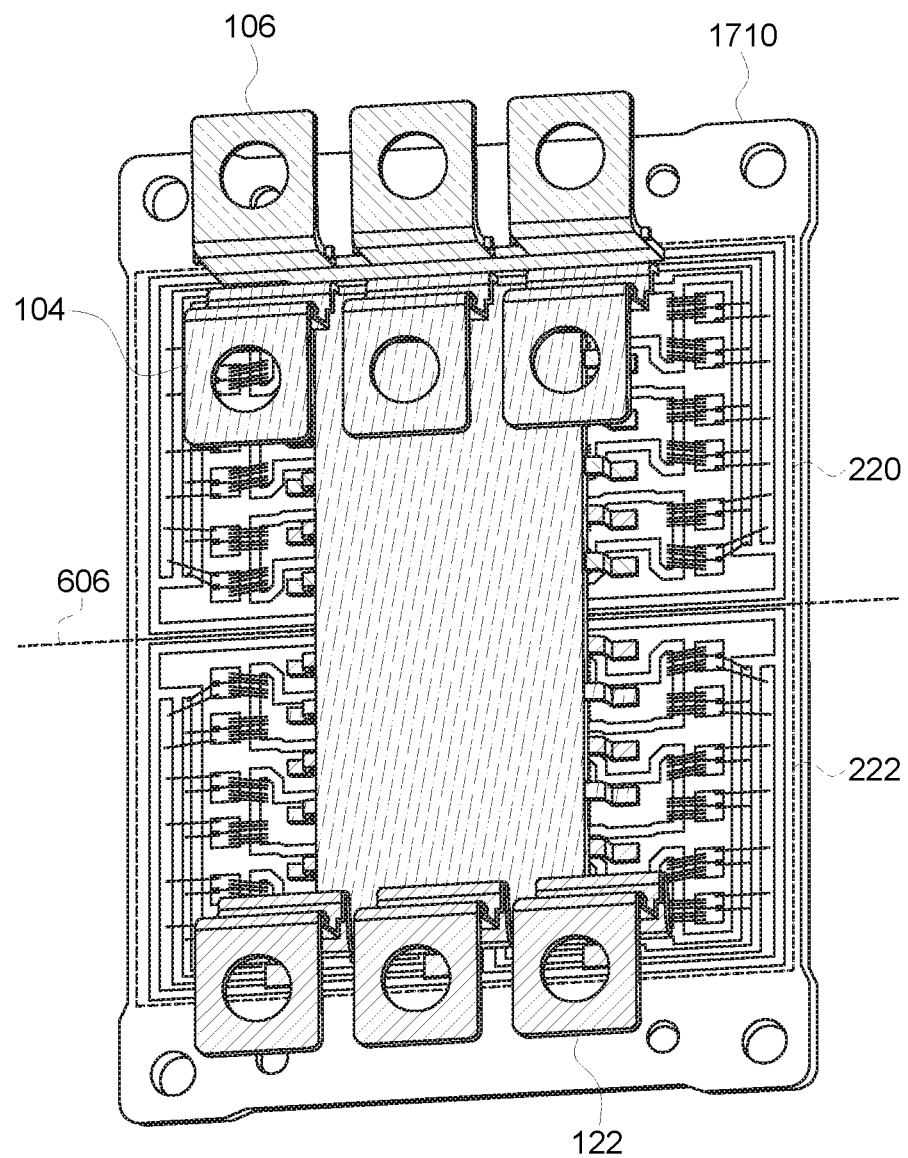

FIGS. 23A-D depict the power module shown in FIG. 22 in progressive fabrication stages and are provided to illustrate the relative placement of each of the base 1710, upper switch 220, lower switch 222, first bus bar 104, second bus bar 106 and third bus bar 122 with respect to one another. Moreover, FIGS. 23A-D depict an embodiment of a sequence for at least partially assembling the module 100/bus bar structure 102. For example, as shown in FIGS. 23A-D, the third bus bar 122 may be first positioned atop the base 1710 (FIG. 23B), the second bus bar 106 may then be positioned above the third bus bar 122 (FIG. 23C) and the first bus bar 104 may then be positioned above the second bus bar 106 (FIG. 23D). The tabs of each of the respective bus bars 104, 106, 122 may be coupled to the traces at any time during the assembly of the module 100 (e.g., each bus bar may be coupled to the respective traces after placement of the bus bar or coupled to the traces after two or more of the bus bars are positioned). The tabs of each of the respective bus bars 104, 106, 122 may be coupled to the traces via any suitable process, for example, such as soldering, welding, brazing or the like.

As such, a power module has been provided herein. The above described power module provides a low inductance bus bar structure and substrate configuration that provides a highly manufacturable, fully scalable and configurable module. In addition, the inventive module provides for a reduction of an overall number of wire bonds that would otherwise be required on the substrate while providing low commutation loop inductance for each pair of interconnects. In addition, the reduction and/or elimination of wire bonds provides flexibility with respect to the location of each terminal configuration, thereby allowing for mating of the DC terminals for lowest overall inductance, and disposing the AC terminal with respect to the DC terminals to provide EMI shielding and return path, and/or adjusting the overall stack configuration for different voltage classes or added insulations. Moreover, such scalability and configurability allows for the module to be readily applied to other module footprints, including industry standard modules such as a 62 mm module housings, 100 mm module housings (a.k.a. nHPD2, LinPak, XHM, . . . ) PrimePACK™, PrimePACK™-style, EconoDUAL™, EconoPACK™, Econo-style, variants and/or derivative designs thereof, or the like.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. Within the written description and throughout the specification and claims features depicted or described with respect to particular embodiments or figures may be combined and/or interchanged with features depicted or described with respect to any other embodiments depicted or described herein.

What is claimed is:

1. A bus bar structure for a power module, comprising:
a first bus bar having a first plurality of tabs extending away from the first bus bar;
a second bus bar having a second plurality of tabs extending away from the second bus bar; and
a third bus bar having a third plurality of tabs extending away from the third bus bar, wherein the first plurality of tabs, second plurality of tabs and third plurality of tabs are arranged such that tabs of the first plurality of tabs and tabs of the second plurality of tabs alternate along a first side of the bus bar structure and tabs of second plurality of tabs and tabs of the third plurality of tabs alternate along a second side of the bus bar structure,
wherein each of the first bus bar, second bus bar and third bus bar comprises a planar component, wherein the first plurality of tabs, second plurality of tabs and third plurality of tabs extend from the planar component of the respective first bus bar, second bus bar and third bus bar, and
wherein the planar component of each of the first bus bar, second bus bar and third bus bar further comprises a respective terminal configured to be coupled to an electrical input or output.

2. The bus bar structure of claim 1, wherein each of the planar components is disposed at least partially above or at least partially below at least one other planar component.

3. The bus bar structure of claim 1, wherein the first bus bar, second bus bar and third bus bar form a laminated bus bar structure.

4. The bus bar structure of claim 1, wherein the first bus bar, second bus bar and third bus bar are electrically isolated from one another.

* * * * *